(12) United States Patent
Matsueda

(10) Patent No.: US 11,783,776 B2
(45) Date of Patent: Oct. 10, 2023

(54) DISPLAY PANEL AND DISPLAY DEVICE

(71) Applicant: Wuhan Tianma Micro-Electronics Co., Ltd., Wuhan (CN)

(72) Inventor: Yojiro Matsueda, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 18/074,246

(22) Filed: Dec. 2, 2022

(65) Prior Publication Data
US 2023/0206845 A1 Jun. 29, 2023

(30) Foreign Application Priority Data
Dec. 24, 2021 (JP) .................................. 2021-211484

(51) Int. Cl.
G09G 3/32 (2016.01)
G09G 3/3233 (2016.01)
H10K 59/35 (2023.01)

(52) U.S. Cl.
CPC ......... G09G 3/3233 (2013.01); H10K 59/352 (2023.02); H10K 59/353 (2023.02); G09G 2300/0413 (2013.01); G09G 2300/0452 (2013.01); G09G 2300/0465 (2013.01); G09G 2300/0814 (2013.01); G09G 2300/0819 (2013.01); G09G 2300/0842 (2013.01); G09G 2300/0861 (2013.01); G09G 2320/0209 (2013.01); G09G 2320/0233 (2013.01)

(58) Field of Classification Search
CPC ......... G09G 3/3233; G09G 2300/0413; G09G 2300/0452; G09G 2300/0465; G09G 2300/0814; G09G 2300/0819; G09G 2300/0842; G09G 2300/0861; G09G 2320/0209; G09G 2320/0233; G09G 3/32; H10K 59/352; H10K 59/353
See application file for complete search history.

(56) References Cited

U.S. PATENT DOCUMENTS

| | | | |
|---|---|---|---|
| 10,998,345 B2 | 5/2021 | Zhang et al. | |
| 2006/0132668 A1* | 6/2006 | Park | G09G 3/3233 345/204 |
| 2008/0117154 A1* | 5/2008 | Yeh | G09G 3/3648 345/90 |
| 2017/0316747 A1 | 11/2017 | Matsueda | |
| 2019/0131589 A1* | 5/2019 | Matsueda | G09G 3/3225 |
| 2019/0378882 A1* | 12/2019 | Zhang | H10K 59/353 |
| 2021/0407369 A1* | 12/2021 | Li | G09G 3/2074 |

* cited by examiner

Primary Examiner — Pegeman Karimi
(74) Attorney, Agent, or Firm — Sughrue Mion, PLLC

(57) ABSTRACT

A display panel includes pixels disposed in a delta-nabla layout. Each data line set consists of three data lines of a data line for a first color, a data line for a second color, and a data line for a third color disposed consecutively. An additional data line for the first color is disposed outside the data line sets. Each pixel circuit for the first color in each of pixel circuit column pairs is supplied with a data signal from a data line for the first color closer to the pixel circuit between the data line for the first color in the associated data line set and the data line for the first color located adjacent to the data line for the third color in the associated data line set outside the associated data line set.

11 Claims, 15 Drawing Sheets

DISPLAY PANEL AND DISPLAY DEVICE

CROSS-REFERENCE TO RELATED APPLICATIONS

This non-provisional application claims priority under 35 U.S.C. § 119(a) on Patent Application No. 2021-211484 filed in Japan on Dec. 24, 2021, the entire content of which is hereby incorporated by reference.

BACKGROUND

This disclosure relates to a display panel and a display device.

In place of liquid crystal display devices, organic light-emitting diode (OLED) display devices are proposed. An organic light-emitting diode (OLED) element is a current-driven light-emitting element and therefore, does not need a backlight. In addition to this, the OLED element has advantages for achievement of low power consumption, wide viewing angle, and high contrast ratio; it is expected to contribute to development of flat panel display devices.

A typical active-matrix color OLED display device has a display region composed of red (R) subpixels, green (G) subpixels, and blue (B) subpixels arrayed on the substrate of a display panel. Various layouts of subpixels (pixel layouts) have been proposed; for example, an RGB stripe layout and a delta-nabla layout (also simply referred to as delta layout) are known.

SUMMARY

An aspect of this disclosure is a display panel in which pixels of three colors of a first color, a second color, and a third color are disposed in a delta-nabla layout. The display panel includes: a plurality of pixel circuit columns; and a plurality of data lines. The plurality of pixel circuit columns extend in a first direction and are disposed side by side in a second direction perpendicular to the first direction. Each of the plurality of pixel circuit columns consists of cyclically disposed pixel circuits for the three colors. Each of the pixel circuits for the three colors is configured to control light intensity of a pixel of the same color assigned to the pixel circuit. The plurality of pixel circuit columns compose a plurality of pixel circuit column pair each consisting of two adjacent pixel circuit columns. The plurality of data lines extend in the first direction and are disposed side by side in the second direction. The plurality of data lines are data lines for the three colors disposed cyclically. Each of the plurality of data lines is configured to transmit data signals to pixel circuits for the same color assigned to the data line. The plurality of data lines include a plurality of data line sets and each data line set consists of three data lines of a data line for the first color, a data line for the second color, and a data line for the third color disposed consecutively. The plurality of data lines includes an additional data line for the first color disposed outside the plurality of data line sets. Each of the plurality of pixel circuit column pairs is associated with a different data line set. Each pixel circuit for the first color in each of the plurality of pixel circuit column pairs is supplied with a data signal from a data line for the first color located closer to the pixel circuit between the data line for the first color in the associated data line set and the data line for the first color located adjacent to the data line for the third color in the associated data line set outside the associated data line set.

It is to be understood that both the foregoing general description and the following detailed description are exemplary and explanatory and are not restrictive of this disclosure.

EMBODIMENTS

Figure 1:
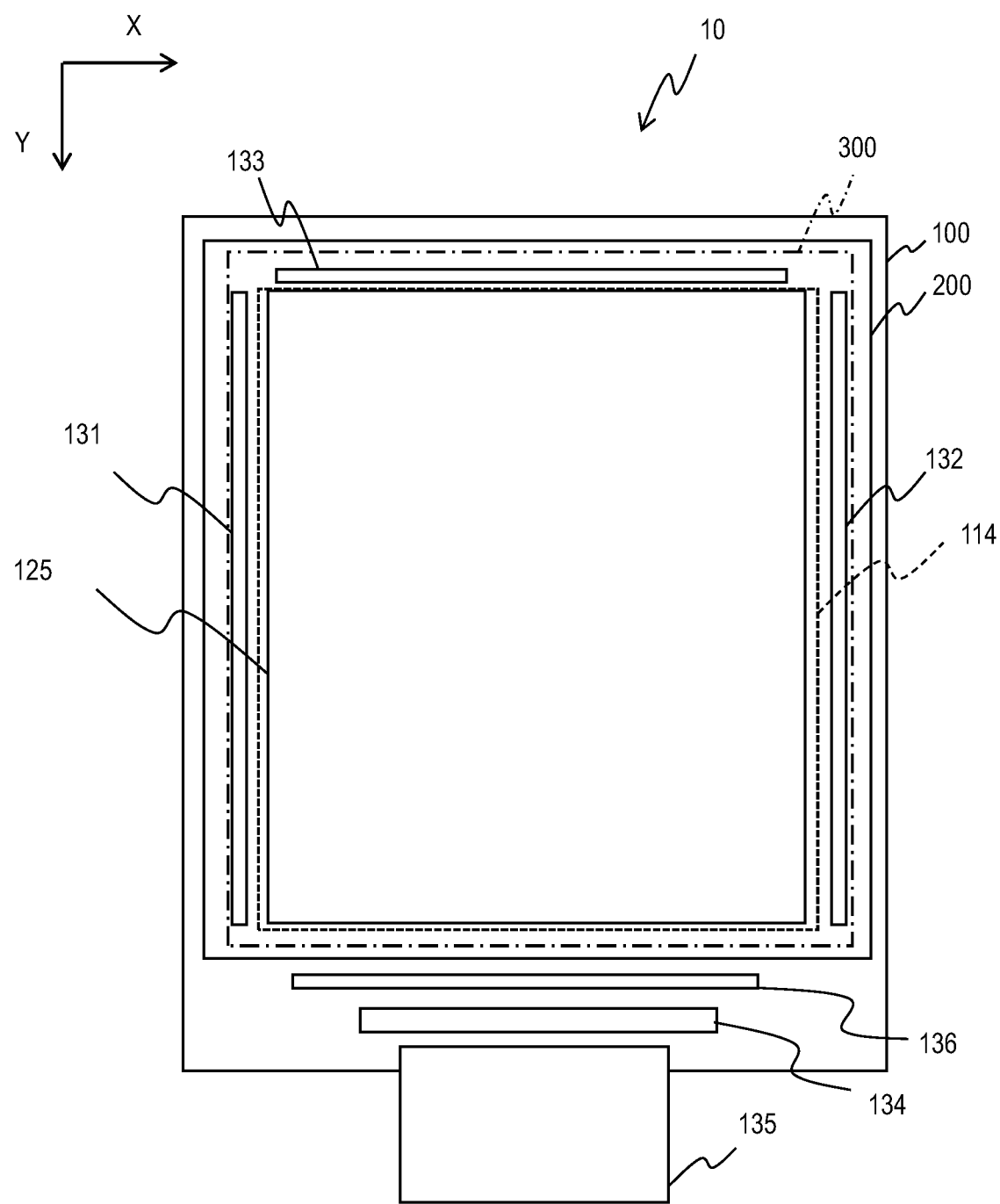
FIG. 1 schematically illustrates a configuration example of an OLED display device.

Hereinafter, embodiments of this disclosure will be described with reference to the accompanying drawings. It should be noted that the embodiments are merely examples to implement this disclosure and are not to limit the technical scope of this disclosure. Elements common to the drawings are denoted by the same reference signs.

A display device can include a demultiplexer (DeMUX) circuit to use a driver circuit having a smaller number of pins for outputting data signals. Each output pin of the driver circuit is associated with a plurality of data lines and the demultiplexer circuit selects the plurality of data lines one by one to output data signals from the output pin.

For a configuration called color rotation where one data line transmits data signals to pixel circuits for different colors of subpixels, it is necessary that each pixel circuit for a specific color should not receive a data signal for a wrong color. The scanning driving has to be controlled so that the periods of data write to the pixel circuits for different colors connected to one data line will not overlap. Such control can be achieved by specifying intermittent data write periods for the plurality of pixel circuits connected to one data line. In a display device employing high resolution or high frame rate driving, however, each data write period is shorter; a problem of insufficient data signal write to the pixel circuits could arise.

Existing delta-nabla display devices including a demultiplexer supply data signals by color rotation. To supply data signals without color rotation, a complicated structure has been required for lead parts for connecting data lines and pixel circuits.

The inventors have studied circuit layouts of a delta-nabla display panel, particularly layouts of pixel circuits for controlling pixels and data lines. The display panel in an embodiment of this specification includes a demultiplexer circuit but attains supply of data signals without color rotation with less interference with the design of a pixel circuit. As a result, the degradation in display caused by insufficient data signal write can be reduced.

Embodiment 1

Configuration of Display Device

An overall configuration of the display device in this embodiment is described with reference to FIG. 1. The elements in the drawings may be exaggerated in size or shape for clear understanding of the description. In the following, an organic light-emitting diode (OLED) display device is described as an example of the display device; however, the features of this disclosure are applicable to display devices of the kinds different from OLED display devices. The features of this disclosure are advantageous especially for display devices that display an image with self-light-emitting elements.

FIG. 1 schematically illustrates a configuration example of an OLED display device 10. The OLED display device 10 includes an OLED display panel and a control device. The OLED display panel includes a thin-film transistor (TFT) substrate 100 on which OLED elements (light-emitting elements) are fabricated, an encapsulation substrate 200 for encapsulating the OLED elements, and a bond (glass frit sealer) 300 for bonding the TFT substrate 100 with the encapsulation substrate 200.

The space between the TFT substrate 100 and the encapsulation substrate 200 is filled with dry nitrogen or dry air and sealed up with the bond 300. Instead of the encapsulation substrate 200, a structural encapsulation unit having a different structure, such as a structural encapsulation unit utilizing thin film encapsulation (TFE), can be employed.

In the periphery of a cathode electrode region 114 outer than the display region 125 of the TFT substrate 100, a scanning driver 131, an emission driver 132, a protection circuit 133, a demultiplexer circuit (DeMUX) 136, and a driver IC 134 are provided. These are connected to the external devices via flexible printed circuits (FPC) 135. The driver IC 134, the scanning driver 131, the emission driver 132, the protection circuit 133, and the demultiplexer circuit 136 are included in the control device.

The scanning driver 131 drives scanning lines on the TFT substrate 100. The emission driver 132 drives emission control lines to control the light emission periods of subpixels. The protection circuit 133 protects the elements from electrostatic discharge. The driver IC 134 is mounted with an anisotropic conductive film (ACF), for example.

The driver IC 134 provides power and timing signals (control signals) to the scanning driver 131 and the emission driver 132 and further, provides power, control signals, and data signals to the demultiplexer circuit 136. The demultiplexer circuit 136 outputs output of one pin of the driver IC 134 to d data lines (d is an integer greater than 1) in turn. The demultiplexer circuit 136 changes the output data line for the data signal from the driver IC 134 d times per scanning period to drive d times as many data lines as output pins of the driver IC 134 (1:d DeMUX).

In FIG. 1, the axis extending from the left to the right is referred to as X-axis and the axis extending from the top to the bottom is referred to as Y-axis. These axes are orthogonal to each other. The scanning lines extend along the X-axis and the data lines extend along the Y-axis. These transmission lines can be straight or partially bent. The pixels or subpixels disposed in a line along the X-axis within the display region 125 are referred to as a pixel row or subpixel row; the pixels or subpixels disposed in a line along the Y-axis within the display region 125 are referred to as a pixel column or subpixel column. A circuit for controlling light emission of a subpixel is referred to as pixel circuit. The following description may simply refer to one light-emitting region or a subpixel as a pixel.

The display region 125 in this embodiment is composed of subpixels disposed in a delta-nabla layout on an insulating substrate. The insulating substrate is a flexible or inflexible substrate made of glass or resin. The details of the delta-nabla layout will be described later. A subpixel is a light-emitting region for displaying one of the colors of red (R), green (G), and blue (B). The examples described in the following display an image with combinations of these three colors.

The light-emitting region is included in an OLED element, which includes an anode electrode as a lower electrode, an organic light-emitting film, and a cathode electrode as an upper electrode. A plurality of OLED elements are made of one cathode electrode, a plurality of anode electrodes, and a plurality of organic light-emitting films. The region where an organic light-emitting film is in contact with an anode electrode is a light-emitting region, namely a subpixel.

Pixel Circuit

Figure 2A:
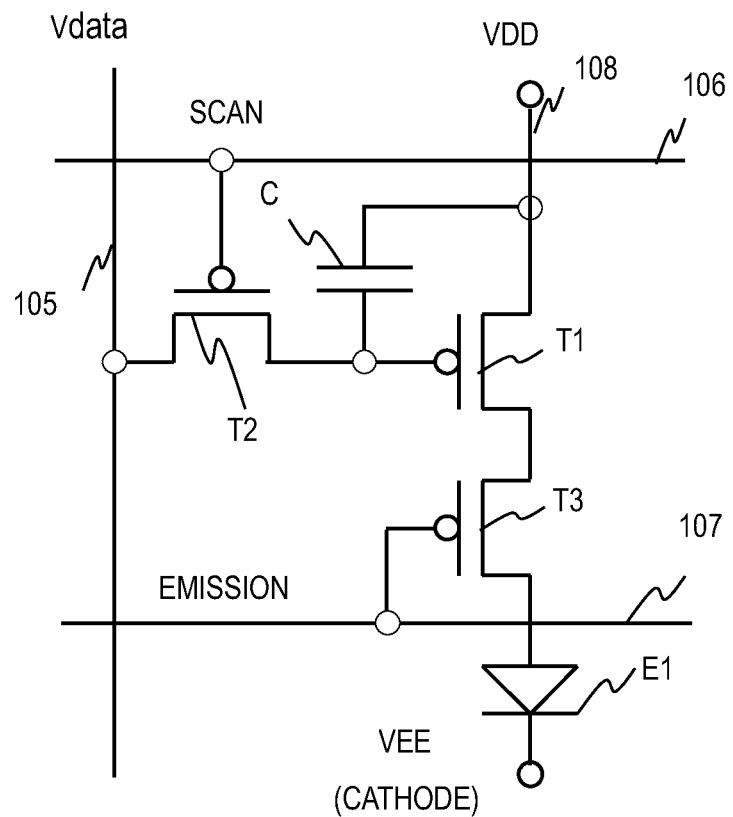
FIG. 2A illustrates an example of a pixel circuit.

A plurality of pixel circuits are fabricated on the TFT substrate 100 to control the current to be supplied to the anode electrodes of subpixels. FIG. 2A illustrates a configuration example of a pixel circuit. Each pixel circuit includes a first transistor T1, a second transistor T2, a third transistor T3, and a storage capacitor C. The pixel circuit controls light emission of an OLED element E1 of a subpixel. The transistors are thin-film transistors (TFTs). Hereinafter, the first transistor T1 to the third transistor T3 are abbreviated as transistor T1 to transistor T3.

The transistor T2 is a switch for selecting the subpixel. The transistor T2 is a p-channel TFT and its gate terminal is connected to a scanning line 106. The drain terminal is connected to a data line (Vdata) 105. The source terminal is connected to the gate terminal of the transistor T1.

The transistor T1 is a transistor (driving TFT) for driving the OLED element E1. The transistor T1 is a p-channel TFT and its gate terminal is connected to the source terminal of the transistor T2. The source terminal of the transistor T1 is connected to a power line (VDD) 108. The drain terminal is connected to the source terminal of the transistor T3. The storage capacitor C is provided between the gate terminal and the source terminal of the transistor T1.

The transistor T3 is a switch for controlling the supply/stop of the driving current to the OLED element E1. The transistor T3 is a p-channel TFT and its gate terminal is connected to an emission control line 107. The source terminal of the transistor T3 is connected to the drain terminal of the transistor T1. The drain terminal is connected to the OLED element E1.

Next, operation of the pixel circuit is described. The scanning driver 131 outputs a selection pulse to the scanning line 106 to turn the transistor T2 ON. The data voltage supplied from the driver IC 134 through the data line 105 is stored to the storage capacitor C. The storage capacitor C holds the stored voltage throughout the period of one frame. The conductance of the transistor T1 changes in an analog manner in accordance with the stored voltage, so that the transistor T1 supplies a forward bias current corresponding to a light emission level to the OLED element E1.

The transistor T3 is located on the supply path of the driving current. The emission driver 132 outputs a control signal to the emission control line 107 to control ON/OFF of the transistor T3. When the transistor T3 is ON, the driving current is supplied to the OLED element E1. When the transistor T3 is OFF, this supply is stopped. The lighting period (duty ratio) in the period of one frame can be controlled by controlling ON/OFF of the transistor T3.

Figure 2B:
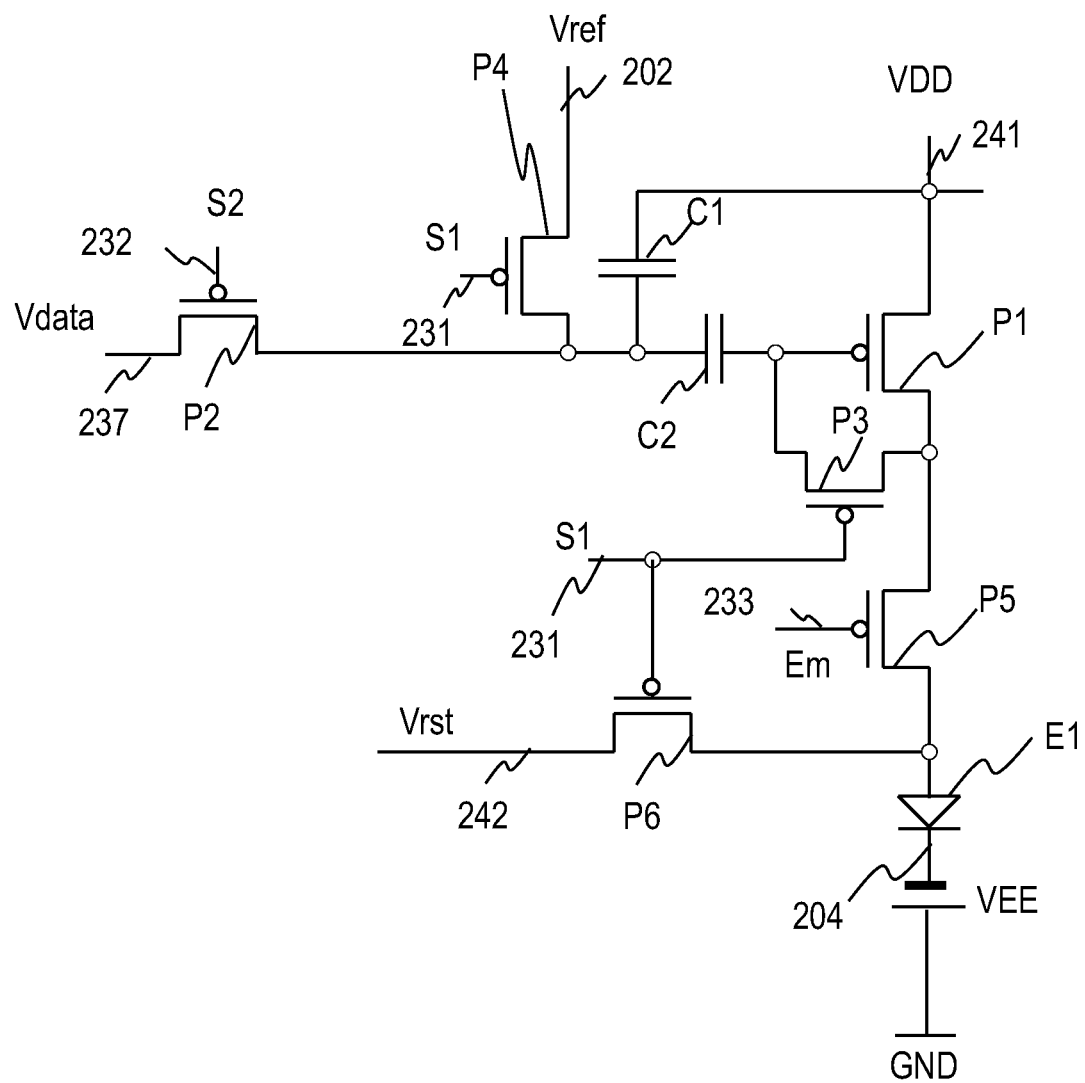
FIG. 2B illustrates another example of a pixel circuit.

FIG. 2B illustrates another configuration example of a pixel circuit in an embodiment of this specification. The pixel circuit is included in a k-th pixel circuit row (k is an integer). The pixel circuit includes six transistors (TFTs) P1 to P6 each having a gate, a source, and a drain. All transistors P1 to P6 in this example are p-type TFTs.

The transistor P1 is a driving transistor for controlling the amount of electric current to an OLED element E1. The source of the driving transistor P1 is connected to a power line 241 for transmitting a positive power supply potential VDD. The driving transistor P1 controls the amount of electric current to be supplied from the power line 241 to the OLED element E1 in accordance with the voltage stored in storage capacitive elements C1 and C2 connected in series. The storage capacitive elements C1 and C2 hold the written voltage throughout the period of one frame. The cathode of the OLED element E1 is connected to a power line 204 for transmitting a negative power supply potential VEE from a cathode power supply.

The capacitive elements C1 and C2 are connected in series between the power line 241 for transmitting the positive power supply potential VDD and the gate of the driving transistor P1. An end of the capacitive element C1 is connected to the power line 241 and the other end of the capacitive element C1 is connected to an end of the capacitive element C2. The other end of the capacitive element C2 is connected to the gate of the driving transistor P1. The source/drain of the transistor P4 and the source/drain of the transistor P2 are connected to an intermediate node between the capacitive elements C1 and C2.

The composite capacitor of the series storage capacitive elements C1 and C2 stores the voltage between the gate of the driving transistor P1 and the power line 241 or the source of the driving transistor P1. The source of the driving transistor P1 is connected to the power line 241; the source potential is at the positive power supply potential VDD. Accordingly, the storage capacitive elements C1 and C2 store the gate-source voltage of the driving transistor P1.

The transistor P5 is an emission control switching transistor for controlling ON/OFF of supply of driving current to the OLED element E1 and the resulting light emission of the OLED element E1. The source of the transistor P5 is connected to the drain of the driving transistor P1. The transistor P5 switches ON/OFF the current supply to the OLED element E1 connected from its drain. The gate of the transistor P5 is connected to a control signal line 233 for transmitting an emission control signal Em and the transistor P5 is controlled by the emission control signal Em from the emission driver 132. The emission control signal is a selection signal for controlling light emission of the OLED element E1.

The transistor P6 works to supply a reset potential Vrst to the anode of the OLED element E1. One end of the source/drain of the transistor P6 is connected to a power line 242 for transmitting the reset potential Vrst and the other end is connected to the anode of the OLED element E1.

The gate of the transistor P6 is connected to a control signal line 231 for transmitting a selection signal S1 and the transistor P6 is controlled by the selection signal S1. When the transistor P6 is turned ON by the selection signal S1 from the scanning driver 131, the transistor P6 supplies the reset potential Vrst transmitted by the power line 242 to the anode of the OLED element E1.

The transistors P5 and P6 also supply the reset potential Vrst to the gate of the driving transistor P1 and one electrode of the storage capacitive element C2 via the transistor P3. As a result, the charge stored to the anode of the OLED element E1 and the storage capacitive elements C1 and C2 in the previous frame is discharged via the transistor P6 and the gate potential of the driving transistor P1 is reset (initialized).

The transistor P3 is a switching transistor (threshold compensation transistor) for writing a voltage for applying threshold calibration (threshold compensation) to the driving transistor P1 to the storage capacitive elements C1 and C2 and is also a transistor for resetting the gate potential of the driving transistor P1. The source and the drain of the transistor P3 connect the gate and the drain of the driving transistor P1. Accordingly, when the transistor P3 is ON, the driving transistor P1 is diode connected.

The transistor P4 is used to write a voltage for applying threshold compensation to the driving transistor P1 to the storage capacitive elements C1 and C2. The transistor P4 controls whether to supply a reference potential Vref to the storage capacitive elements C1 and C2. The reference potential Vref can be equal to the positive power supply potential VDD. Then, a transmission line (power line) can be shared between the reference potential Vref and the positive power supply potential VDD. One end of the source/drain of the transistor P4 is connected to a power line 202 for transmitting the reference potential Vref and the other end is connected to an intermediate node between the capacitive elements C1 and C2. The gate of the transistor P4 is connected to the control signal line 231 for transmitting the selection signal S1 and the transistor P4 is controlled by the selection signal S1 input from the scanning driver 131 to its gate.

The transistors P3, P6, and P4 are controlled by the selection signal S1. Accordingly, these transistors P3, P6, and P4 are turned ON/OFF simultaneously. In the period where these transistors are ON, the transistor P5 is turned ON to reset the gate potential of the driving transistor P1 and then turned OFF. When the transistors P3 and P4 are ON, the transistor P1 is a diode-connected transistor. A threshold compensation voltage based on the positive power supply potential VDD and the reference potential Vref is written to the storage capacitive elements C1 and C2.

The transistor P2 is a switching transistor for selecting a pixel circuit to be supplied with a data signal and writing the data signal (data signal voltage) Vdata to the storage capacitive elements C1 and C2. One end of the source/drain of the transistor P2 is connected to the storage capacitive elements C1 and C2 and the other end is connected to a data line 237 for transmitting the data signal Vdata.

The gate of the transistor P2 is connected to a control signal line 232 for transmitting a selection signal S2 from the scanning driver 131. The transistor P2 is controlled by the selection signal S2. The selection signal S2 is a signal different from the selection signal S1. For the pixel circuit, the selection signal S2 is a selection signal for controlling supply of the data signal Vdata to the storage capacitive elements C1 and C2. When the transistor P2 is ON, the transistor P2 supplies the data signal Vdata supplied from the driver IC 134 through the data line 237 to the storage capacitive elements C1 and C2.

Pixel Layout in Delta-Nabla Panel

Figure 3:
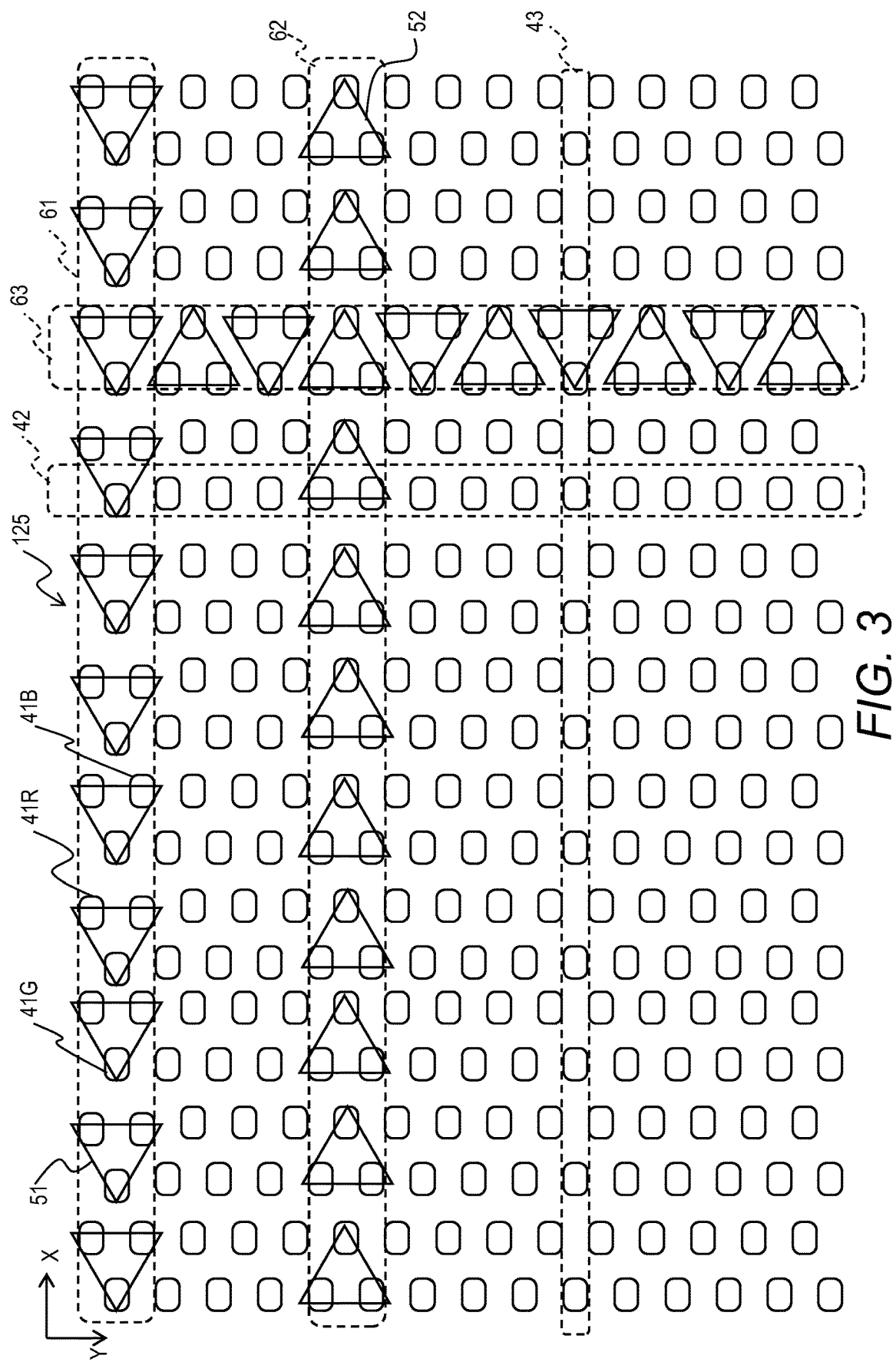
FIG. 3 illustrates a pixel layout in a delta-nabla panel.

FIG. 3 illustrates a pixel (subpixel) layout in a delta-nabla panel. FIG. 3 schematically illustrates a partial region of the display region 125. The display region 125 is composed of a plurality of red subpixels 41R, a plurality of green subpixels 41G, and a plurality of blue subpixels 41B disposed in a plane. Each subpixel is one light-emitting region for one color of light. In FIG. 3, one of the red subpixels, one of the green subpixels, and one of the blue subpixels are provided with reference signs by way of example. The rounded rectangles identically hatched in FIG. 3 represent subpixels of the same color. Although the subpixels in FIG. 3 have rectangular shapes, subpixels may have desired shapes, such as hexagonal or octagonal shapes.

The display region 125 includes a plurality of subpixel columns 42 disposed side by side in the X-direction. In FIG. 3, one of the subpixel columns is provided with a reference sign 42 by way of example. Each subpixel column 42 is composed of subpixels disposed one above another in the Y-direction in FIG. 3. The X-direction is a direction extending from the left to the right of FIG. 3 (the direction along the X-axis) and the Y-direction is a direction extending from the top to the bottom of FIG. 3 (the direction along the Y-axis). The X-direction and the Y-direction are perpendicular to each other in the plane where the subpixels are disposed.

Each subpixel column 42 is composed of red subpixels 41R, green subpixels 41G, and blue subpixels 41B disposed cyclically at a predetermined pitch. In the example of FIG. 3, one cycle consists of a red subpixel 41R, a blue subpixel 41B, and a green subpixel 41G disposed in this order. Two subpixel columns 42 adjacent to each other are located differently in the Y-direction; each subpixel of one subpixel column 42 is located between subpixels of the other two colors in the other subpixel column 42 in the Y-direction.

In the example of FIG. 3, each subpixel column is shifted by a half pitch with respect to the adjacent subpixel columns. One pitch is a distance between subpixels of the same color in the Y-direction. For example, a green subpixel 41G is located at the middle between a red subpixel 41R and a blue subpixel 41B of an adjacent subpixel column 42 in the Y-direction.

The display region 125 includes a plurality of subpixel rows 43 disposed one above another in the Y-direction. In FIG. 3, one of the green subpixel rows is provided with a reference sign 43 by way of example. Each subpixel row 43 is composed of subpixels disposed side by side in the X-direction at a predetermined pitch. In the example of FIG. 3, each subpixel row 43 is composed of subpixels of the same color. Each subpixel row 43 is sandwiched by subpixel rows of the other two colors along the Y-axis.

In the X-direction, each subpixel of a subpixel row 43 is located between subpixels adjacent to each other in an adjacent subpixel row 43. In the example of FIG. 3, each subpixel row is shifted by a half pitch with respect to the adjacent subpixel rows. One pitch is a distance between subpixels adjacent to each other in a subpixel row 43. A subpixel is located at the middle between two subpixels adjacent to each other in an adjacent subpixel row 43 in the X-direction.

In this embodiment, a subpixel line extending along the X-axis is referred to as subpixel row and a subpixel line extending along the Y-axis is referred to as subpixel column for descriptive purposes; however, the orientations of the subpixel rows and the subpixel columns are not limited to these examples.

The display region 125 includes two types of main pixels disposed in a matrix. The two types of main pixels are first type of main pixels 51 and second type of main pixels 52. In FIG. 3, only one of the first type of main pixels is provided with a reference sign 51 and only one of the second type of main pixels is provided with a reference sign 52 by way of example. Either the first type of main pixels or the second type of main pixels are delta pixels and the remaining are nabla pixels in the delta-nabla layout.

In FIG. 3, some of the first type of main pixels 51 are indicated by triangles oriented so that one of the vertices is located on the left and the other two vertices are located on the right. In addition, some of the second type of main pixels 52 are indicated by triangles oriented so that one of the vertices is located on the right and the other two vertices are located on the left. The right in FIG. 3 is on the side of the X-direction and the left in FIG. 3 is on the opposite side of the X-direction. The main pixels 51 can be referred to as second type of main pixels and the main pixels 52 can be referred to as first type of main pixels.

A first type of main pixel 51 and a second type of main pixel 52 each consist of one green subpixel 41G, and the red subpixel 41R and the blue subpixel 41B adjacent to (closest to) the green subpixel 41G in a subpixel column 42 adjacent to the subpixel 41G.

In a first type of main pixel 51, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B on the opposite side of the X-direction, or on the left in FIG. 3. The green subpixel 41G is located between, more specifically, at the middle between the red subpixel 41R and the blue subpixel 41B along the Y-axis.

In a second type of main pixel 52, the red subpixel 41R and the blue subpixel 41B are disposed consecutively in the same subpixel column 42. The subpixel column 42 including the green subpixel 41G is adjacent to the subpixel column 42 including the red subpixel 41R and the blue subpixel 41B on the side of the X-direction, or on the right in FIG. 3. The green subpixel 41G is located between, more specifically, at the middle between the red subpixel 41R and the blue subpixel 41B along the Y-axis.

The display region 125 includes a plurality of main-pixel rows (pixel lines extending along the X-axis) extending along the X-axis and disposed one above another along the Y-axis. The plurality of main-pixel rows include two types of main-pixel rows: first type of main-pixel rows 61 and second type of main-pixel rows 62. In FIG. 3, one of the first type of main-pixel rows is provided with a reference sign 61 by way of example. Further, one of the second type of main-pixel rows is provided with a reference sign 62 by way of example.

A first type of main-pixel row 61 is composed of first type of main pixels 51 disposed side by side in the X-direction. A second type of main-pixel row 62 is composed of second type of main pixels 52 disposed side by side in the X-direction. In the display region 125, first type of main-pixel rows 61 and second type of main-pixel rows 62 are disposed alternately in the Y-direction.

The display region 125 includes a plurality of main-pixel columns (pixel lines extending along the Y-axis) 63 extending along the Y-axis and disposed side by side along the X-axis. In FIG. 3, one of the main-pixel columns is provided with a reference sign 63 by way of example. Each main-pixel column 63 is composed of first type of main pixels 51 and second type of main pixels 52 disposed alternately along the Y-axis at a predetermined pitch.

Layout of Data Lines and Pixel Circuits

Figure 4:
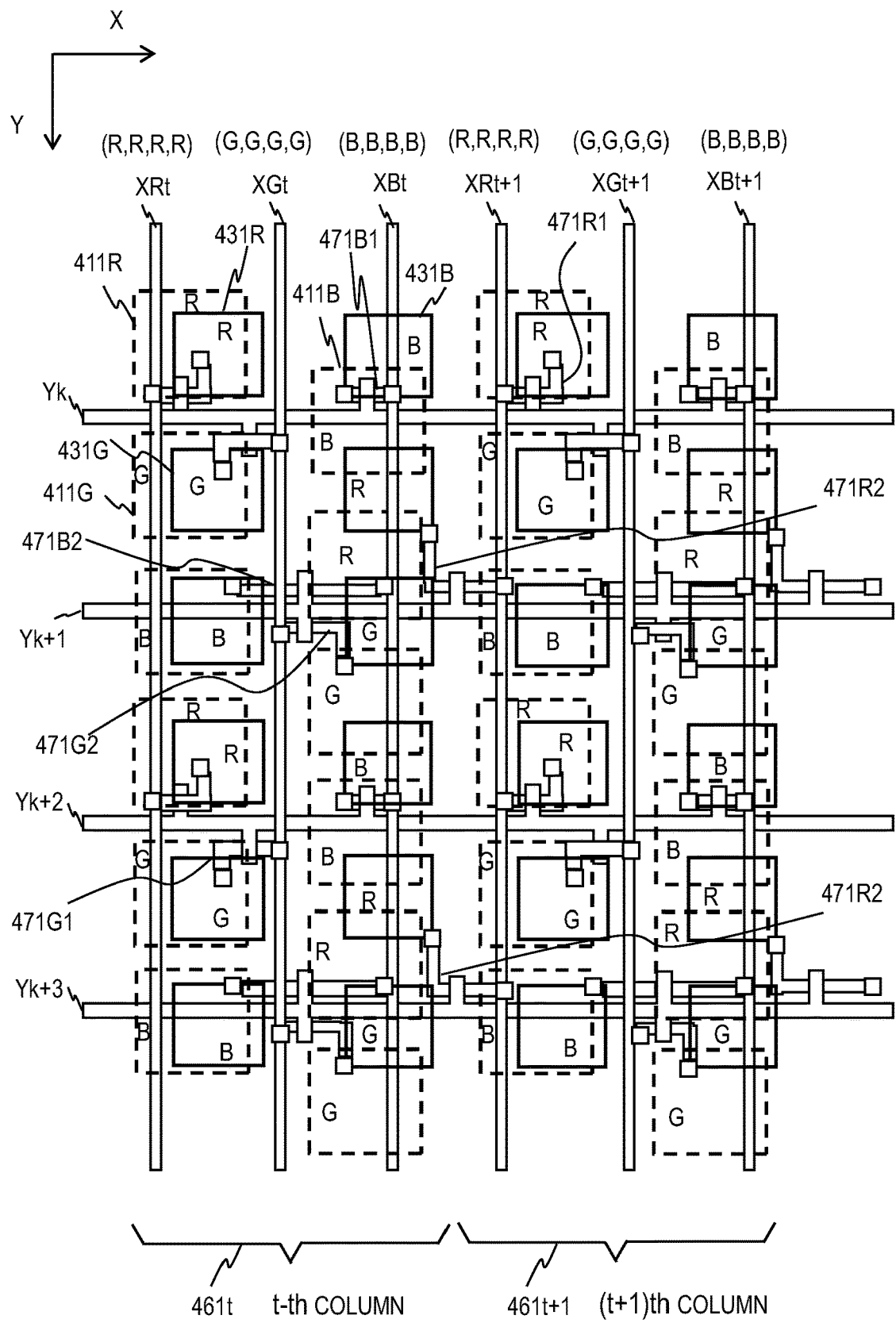
FIG. 4 illustrates a circuit layout in an embodiment of this specification, including subpixels (light-emitting regions), pixel circuits, scanning lines, and data lines.

FIG. 4 illustrates a part of a circuit layout in an embodiment of this specification, more specifically, an example of a layout of subpixels (light-emitting regions), pixel circuits (showing only the region where elements are disposed, instead of the patterns of individual elements), switching transistors for controlling data write to the pixel circuits, scanning lines, and data lines. In FIG. 4, a plurality of subpixels (light-emitting regions) are represented by rectangles in dashed lines. One of the red subpixels is provided with a reference sign 411R, one of the green subpixels is provided with a reference sign 411G, and one of the blue subpixels is provided with a reference sign 411B, by way of example.

The letters R, G, and B inside the rectangles in dashed lines represent red, green, and blue, respectively. One subpixel (also simply referred to as pixel) is a light-emitting region, which is a contact region of an organic light-emitting laminate member with an anode electrode. As described with reference to FIG. 3, the subpixels are disposed in a delta-nabla layout. In similar, the anode electrodes are also disposed in the delta-nabla layout.

The regions each including a pixel circuit for controlling light emission of a subpixel are represented by rectangles in solid lines. These regions are referred to as pixel circuit regions or simply, pixel circuits. One of the pixel circuits for red subpixels is provided with a reference sign 431R, one of the pixel circuits for green subpixels is provided with a reference sign 431G, and one of the pixel circuits for blue subpixels is provided with a reference sign 431B, by way of example. The letters R, G, and B inside the rectangles in solid lines represent the colors of subpixels to be controlled by the pixel circuits. Hereinafter, a pixel circuit for a red subpixel is referred to as pixel circuit for red color, a pixel circuit for a green subpixel is referred to as pixel circuit for green color, and a pixel circuit for a blue subpixel is referred to as pixel circuit for blue color.

The pixel circuits 431R, 431G, and 431B are distant from one another without any overlap. The region included in one pixel circuit is located outside all the other pixel circuit. Although the pixel circuits in the configuration example of FIG. 4 have rectangular shapes, other shapes are not eliminated. The pixel circuits for controlling subpixels of the same color have the identical shapes but the pixel circuits for controlling subpixels of different colors can have different shapes.

The plurality of pixel circuits 431R, 431G, and 431B are disposed in a layout different from the layout of subpixels. In the example of FIG. 4, the plurality of pixel circuits 431R, 431G, and 431B are disposed in a matrix. The plurality of pixel circuits compose a plurality of pixel circuit rows or a plurality of pixel circuit columns. Each pixel circuit row consists of pixel circuits aligned in the X-direction and the plurality of pixel circuit rows are disposed one above another in the Y-direction. Each pixel circuit column consists of pixel circuits aligned in the Y-direction and the plurality of pixel circuit columns are disposed side by side in the X-direction.

In the configuration example of FIG. 4, all pixel circuits 431R, 431G, and 431B have the identical shapes and occupy equal areas. The centroids of the pixel circuits in one pixel circuit row are located on a straight line extending in the X-direction and the centroids of the pixel circuits in one pixel circuit column are located on a straight line extending in the Y-direction.

In FIG. 4, two left pixel circuit columns control the subpixels in the t-th main-pixel column 461$t$ (t is an integer) and two right pixel circuit columns control the subpixels in the (t+1)th main-pixel column 461$t$+1. As described with reference to FIG. 3, one main-pixel column consists of two subpixel columns adjacent to each other. One main pixel consists of three subpixels of different colors included in three subpixel rows and two subpixel columns. As understood from this description, the plurality of pixel circuit columns compose a plurality of pixel circuit column pairs each associated with a different main-pixel column.

In each pixel circuit column, pixel circuits for three colors are disposed cyclically. In the example of FIG. 4, a cycle consisting of a pixel circuit for red color, a pixel circuit for green color, and a pixel circuit for blue color in this order is disposed repeatedly from the top toward the bottom. The positions of two adjacent pixel circuit columns are different by one pixel circuit. Namely, the arrangements of two adjacent pixel circuit columns stagger one pixel circuit. Accordingly, two pixel circuits in the same pixel circuit row in two adjacent pixel circuit columns are for different colors. Among the odd-numbered pixel circuit columns, the relation between the assigned color and the position in the Y-direction of each pixel circuit is in common. Among the even-numbered pixel circuit columns, the relation between the assigned color and the position in the Y-direction of each pixel circuit is in common.

Each pixel circuit row is composed of alternately disposed pixel circuits for two different colors. Two adjacent pixel circuit rows are composed of pixel circuits for different color pairs. In the example of FIG. 4, the uppermost pixel circuit row is composed of alternately disposed pixel circuits for red color and pixel circuits for blue color; the next pixel circuit row is composed of alternately disposed pixel circuits for green color and pixel circuits for red color; and the pixel circuit row after the next is composed of alternately disposed pixel circuits for blue color and pixel circuits for green color.

FIG. 4 illustrates a plurality of data lines extending in the Y-direction and disposed side by side in the X-direction. Data lines for transmitting data signals to pixel circuits for three colors are cyclically disposed in the X-direction. Although the data lines in FIG. 4 extend straight, data lines can be partially bent.

The data lines XR$t$ and XR$t$+1 are the t-th and the (t+1)th data lines for transmitting data signals to pixel circuits 431R for red color. The data lines XR$t$ and XR$t$+1 are connected to a plurality of pixel circuits 431R for red color and are not connected to pixel circuits for the other colors. A data line for pixel circuits for red color is also referred to as data line for red color.

The data lines XGt and XGt+1 are the t-th and the (t+1)th data lines for transmitting data signals to pixel circuits 431G for green color. The data lines XGt and XGt+1 are connected to a plurality of pixel circuits 431G for green color and are not connected to pixel circuits for the other colors. A data line for pixel circuits for green color is also referred to as data line for green color.

The data lines XBt and XBt+1 are the t-th and the (t+1)th data lines for transmitting data signals to pixel circuits 431B for blue color. The data lines XBt and XBt+1 are connected to a plurality of pixel circuits 431B for blue color and are not connected to pixel circuits for the other colors. A data line for pixel circuits for blue color is also referred to as data line for blue color.

As described above, each data line in an embodiment of this specification successively transmits data signals to pixel circuits for only one color. In general, the data for adjacent subpixels of the same color to display average images have small differences in RGB levels. Accordingly, even if the selection period for the data lines is unchanged, the efficiency in writing a signal to each data line increases, so that the degradation in image quality caused by insufficient data signal write to the pixel circuits reduces.

The data lines XRt, XGt, and XBt constitute one data line set and they are associated with a pixel circuit column pair for controlling the main-pixel column 461t. In similar, the data lines XRt+1, XGt+1, and XBt+1 constitute one data line set and they are associated with a pixel circuit column pair for controlling the main-pixel column 461t+1.

As noted from these examples, each data line set consists of data lines different from the data lines constituting any other data line set; each data line set consists of three consecutive data lines for different colors. Each data line set is associated with a different main-pixel column or a different pixel circuit column pair.

In the configuration example of FIG. 4, the data line XGt is a data line closest to the center in the X-direction of the pixel circuit column pair associated with the main-pixel column 461t and it extends in between the subpixel columns of the main-pixel column 461t. The data line XRt is a data line closest to the left end of this pixel circuit column pair and the data line XBt is a data line closet to the right end of this pixel circuit column pair.

The positional relations of the data lines XRt+1, XGt+1, and XBt+1 to the pixel circuit column pair associated with the main-pixel column 461t+1 are the same as the positional relations of the data lines XRt, XGt, and XBt to the pixel circuit column pair associated with the main-pixel column 461t. The illustrated in FIG. 4 is an example of the positional relation between a pixel circuit column pair and a data line set and the positional relation is not limited to this example.

Each pixel circuit is connected to a data line by a lead part including a switching TFT. In FIG. 4, some of the lead parts connecting a data line for red color and a pixel circuit for red color are provided with a reference sign 471R1 or 471R2. Some of the lead parts connecting a data line for green color and a pixel circuit for green color are provided with a reference sign 471G1 or 471G2. Some of the lead parts connecting a data line for blue color and a pixel circuit for blue color are provided with a reference sign 471B1 or 471B2.

The switching TFT of each lead part is turned ON/OFF by one of the scanning lines Yk to Yk+3 (k is an integer). The scanning lines Yk to Yk+3 are disposed to extend in the X-direction and located one above another along the Y-direction. Each scanning line switches ON/OFF the conduction of pixel circuits to data lines by turning ON/OFF the switching TFTs in the lead parts.

Figure 5:
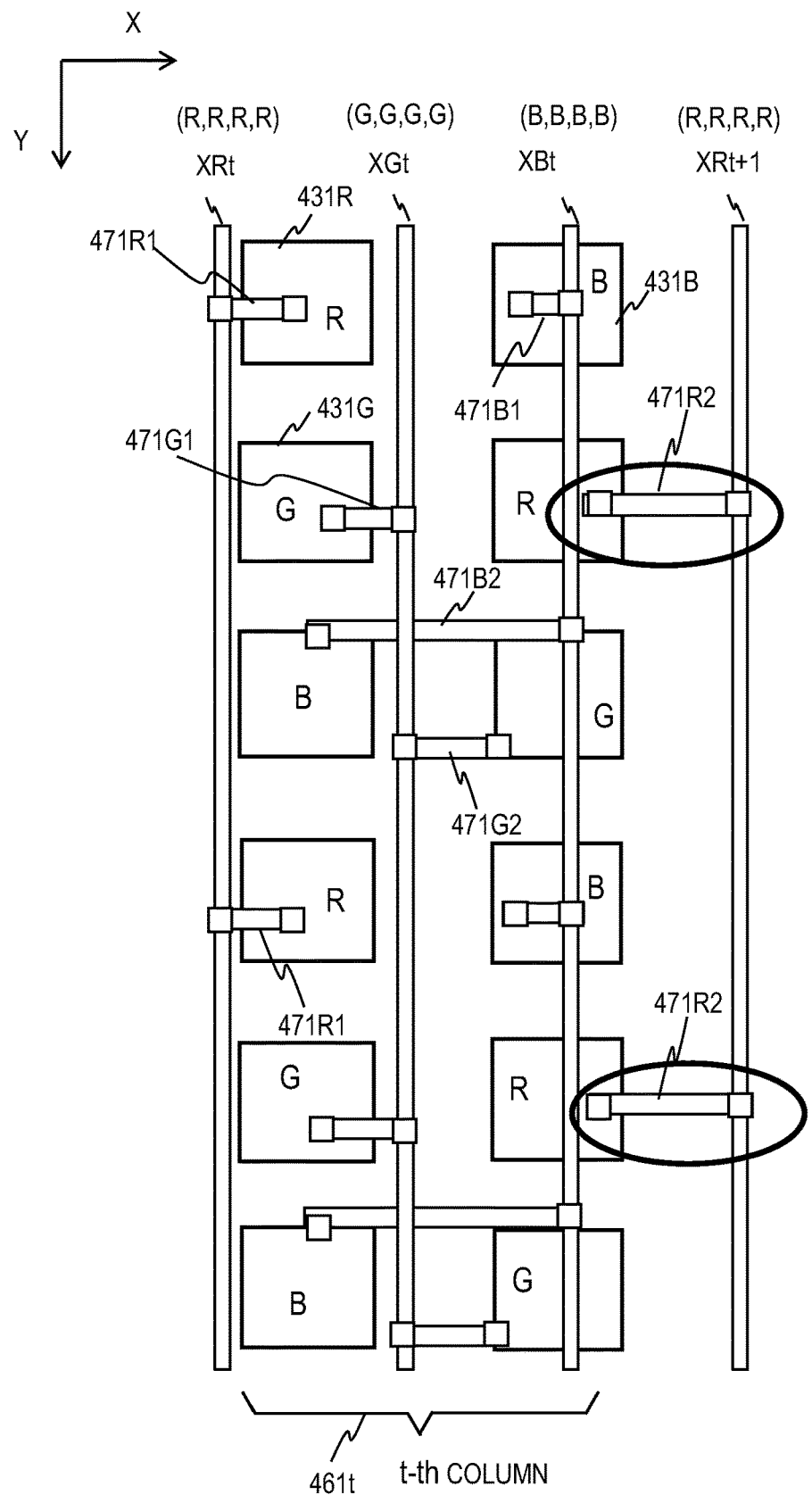
FIG. 5 is a diagram for explaining lead parts for connecting a data line and a pixel circuit.

FIG. 5 is a diagram for explaining lead parts for connecting a data line and a pixel circuit. FIG. 5 illustrates data lines XRt, XGt, XBt, and XRt+1, pixel circuits in the main-pixel column 461t, and lead parts between the data lines and the pixel circuits.

Each of the data lines for green color including the data lines XGt and XGt+1 transmits data signals to the pixel circuits for green color in the pixel circuit column pair constituting the main-pixel column associated with the data line. In the configuration example of FIG. 5, the data line XGt for green color and the pixel circuits 431G for green color in the left pixel circuit column of the pixel circuit column pair associated with the data line XGt are connected by lead parts 471G1. The data line XGt for green color and the pixel circuits 431G for green color in the right pixel circuit column of the associated pixel circuit column pair are connected by lead parts 471G2. Each lead part connects a data line for green color and a pixel circuit for green color without crossing any data line.

Each of the data lines for blue color including the data lines XBt and XBt+1 transmits data signals to the pixel circuits for blue color in the pixel circuit column pair constituting the main-pixel column associated with the data line. In the configuration example of FIG. 5, the data line XBt for blue color and the pixel circuits 431B for blue color in the left pixel circuit column of the pixel circuit column pair associated with the data line XBt are connected by lead parts 471B2. The data line XBt for blue color and the pixel circuits 431B for blue color in the right pixel circuit column of the associated pixel circuit column pair are connected by lead parts 471B1.

Each lead part 471B1 for blue color connects the data line XBt for blue color and a pixel circuit 431B for blue color without crossing any data line. In contrast, each lead part 471B2 for blue color is long and crosses the data line XGt for green color. Such a long lead part occupies a large area and therefore, reduces the utility area of the pixel circuit. Further, a crossing of a lead part and a line interferes with disposition of elements and it may cause a crosstalk. Accordingly, it is desirable that lead parts be short and the number of crossings of a lead part and a data line be small.

In the configuration example of FIGS. 4 and 5, lead parts between a data line for red color and a pixel circuit for red color are provided to avoid other data lines. A data line for red color transmits data signals to pixel circuits for red color in the associated pixel circuit column pair and pixel circuits for red color in one of the pixel circuit column pairs adjacent to the associated pixel circuit column pair.

In the configuration example of FIG. 5, the pixel circuits for red color in the left pixel circuit column of the pixel circuit column pair for the main-pixel column 461t are connected to the data line XRt for red color by lead parts 471R1. The data line XRt for red color is included in the data line set associated with this pixel circuit column pair. The pixel circuits for red color in the right pixel circuit column of this pixel circuit column pair are connected to the data line XRt+1 for red color by lead parts 471R2. The data line XRt+1 is closer to the right pixel circuit column than the data line XRt. All of the lead parts 471R1 and 471R2 connect a pixel circuit and a data line without crossing any data line.

As understood from the above description, each pixel circuit for red color in a pixel circuit column pair is supplied from the data line for red color closest to the pixel circuit among the data line for red color in the associated data line set and the data lines for red color not included in the associated data line set. All lead parts connect a data line for red color and a pixel circuit for red color without crossing any other data line.

The configuration example of FIGS. 4 and 5 connects pixel circuits for red color in a pixel circuit column pair to data lines for red color in different data line sets. Another configuration example can configure the lead parts for another color, for example, blue color, as described above. The order of colors of the data lines in the X-direction can be different from the example in FIGS. 4 and 5 and the lead parts for the color selected depending on the order can be configured like the lead parts 471R1 and 471R2.

Figure 6A:
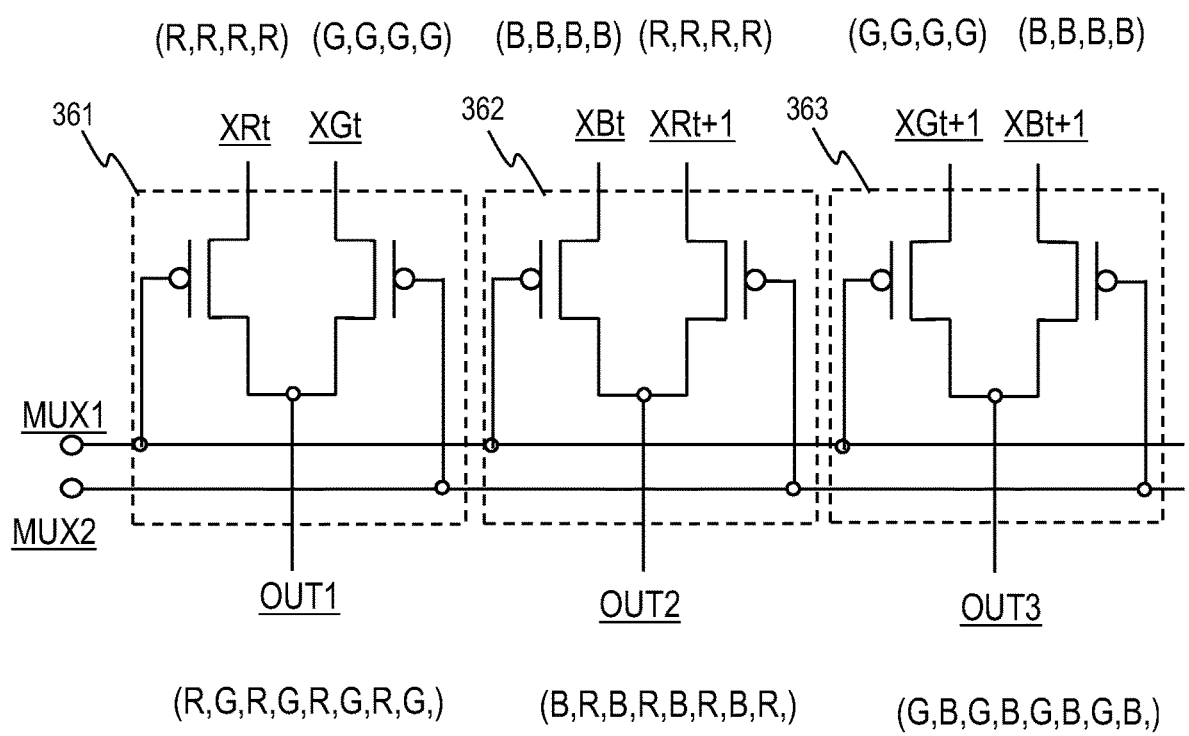
FIG. 6A schematically illustrates a configuration example of a demultiplexer circuit provided between the data lines illustrated in FIG. 4 and a driver IC.

FIG. 6A schematically illustrates a configuration example of the demultiplexer circuit 136 provided between the data lines illustrated in FIG. 4 and the driver IC 134. FIG. 6A illustrates an example of a 1:2 DeMUX circuit to process the outputs of the driver IC 134 output by color rotation.

FIG. 6A includes three demultiplexers 361, 362, and 363 associated with the output terminals OUT1, OUT2, and OUT3 of the driver IC 134. The demultiplexer 361 outputs a data signal received from the output terminal OUT1 of the driver IC 134 through its input terminal to a data line selected from the data lines XRt and XGt. The output terminal OUT1 outputs a data signal for a pixel circuit for red color and a data signal for a pixel circuit for green color alternately (by color rotation).

The demultiplexer 362 outputs a data signal received from the output terminal OUT2 of the driver IC 134 through its input terminal to a data line selected from the data lines XBt and XRt+1. The output terminal OUT2 outputs a data signal for a pixel circuit for blue color and a data signal for a pixel circuit for red color alternately (by color rotation).

The demultiplexer 363 outputs a data signal received from the output terminal OUT3 of the driver IC 134 through its input terminal to a data line selected from the data lines XGt+1 and XBt+1. The output terminal OUT3 outputs a data signal for a pixel circuit for green color and a data signal for a pixel circuit for blue color alternately (by color rotation).

Selection of a data line at each demultiplexer is controlled by selection signals from control terminals MUX1 and MUX2. The selection signals can be supplied from the driver IC 134. The configuration illustrated in FIG. 6A contributes to achievement of a slim bezel with simple wiring in the demultiplexer circuit 136.

Figure 6B:
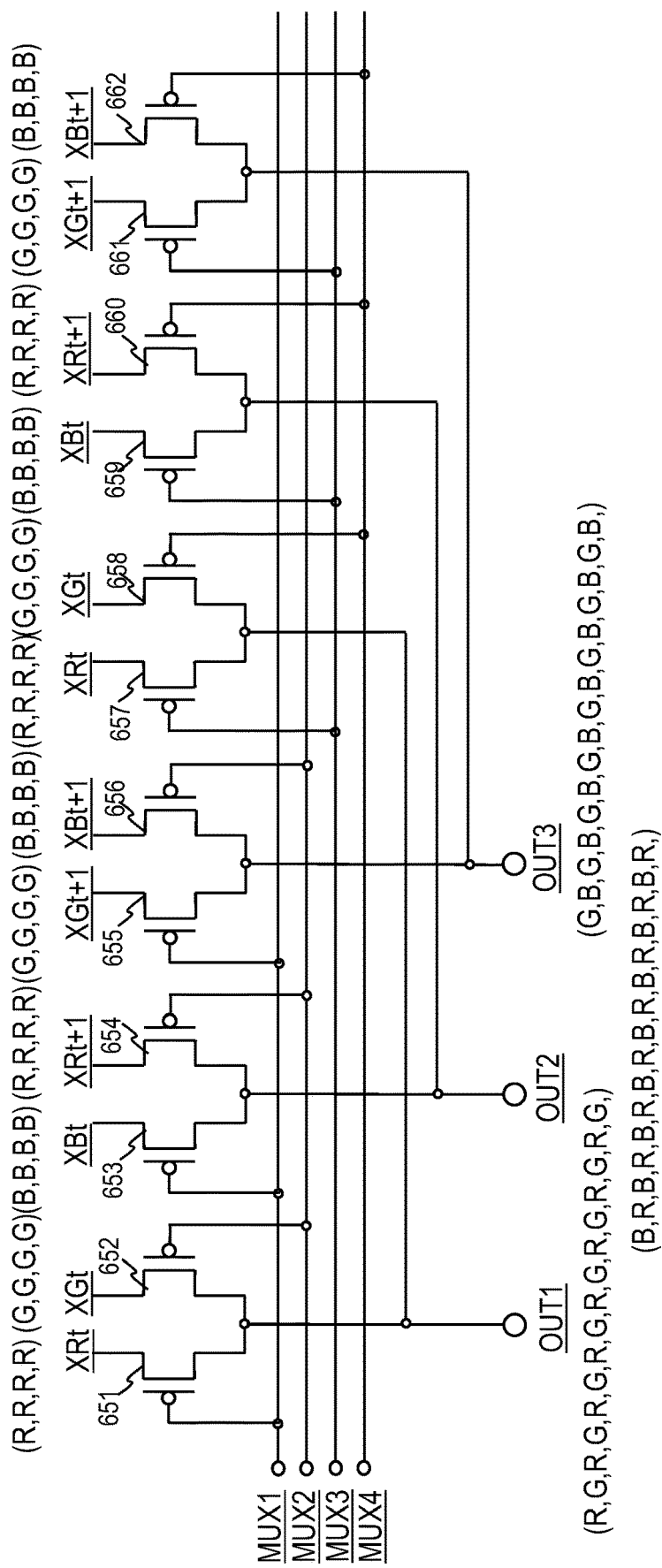
FIG. 6B illustrates a configuration example of a 1:4 DeMUX circuit.

FIG. 6B illustrates a configuration example of a 1:4 DeMUX circuit. In this configuration example, each output terminal of the driver IC 134 successively outputs data signals for pixel circuits for different colors (by color rotation). This configuration contributes to achievement of a slimmer bezel with simple wiring in the demultiplexer circuit 136.

The demultiplexer circuit 136 includes a plurality of switching TFTs 651 to 662. The switching TFTs 651 and 657 are connected to the data line XRt. The switching TFTs 652 and 658 are connected to the data line XGt. The switching TFTs 653 and 659 are connected to the data line XBt. The switching TFTs 654 and 660 are connected to the data line XRt+1. The switching TFTs 655 and 661 are connected to the data line XGt+1. The switching TFTs 656 and 662 are connected to the data line XBt+1.

The ON/OFF of the switching TFTs 651, 653, and 655 is controlled by the selection signal from the control terminal MUX1. The ON/OFF of the switching TFTs 652, 654, and 656 is controlled by the selection signal from the control terminal MUX2. The ON/OFF of the switching TFTs 657, 659, and 661 is controlled by the selection signal from the control terminal MUX3. The ON/OFF of the switching TFTs 658, 660, and 662 are controlled by the selection signal from the control terminal MUX4.

The control terminals MUX1 to MUX4 cyclically and repeatedly output an ON pulse. The control terminals MUX1 and MUX2 successively output an ON pulse within one horizontal period and the control terminals MUX3 and MUX4 successively output an ON pulse within the next horizontal period.

The demultiplexer connected from the output terminal OUT1 include switching TFTs 651, 652, 657, and 658. The output terminal OUT1 outputs a data signal for a pixel circuit for red color and a data signal for a pixel circuit for green color alternately. The demultiplexer connected from the output terminal OUT2 include switching TFTs 653, 654, 659, and 660. The output terminal OUT2 outputs a data signal for a pixel circuit for blue color and a data signal for a pixel circuit for red color alternately. The demultiplexer connected from the output terminal OUT3 include switching TFTs 655, 656, 661, and 662. The output terminal OUT3 outputs a data signal for a pixel circuit for green color and a data signal for a pixel circuit for blue color alternately.

Figure 7:
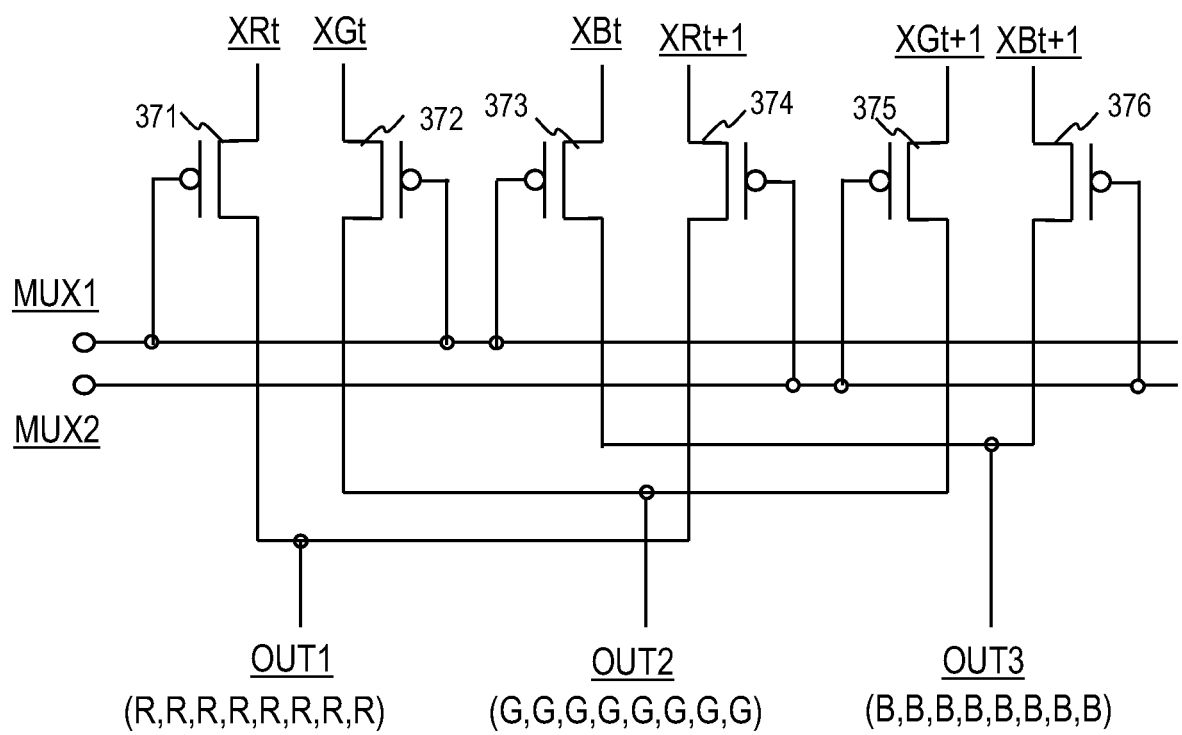
FIG. 7 schematically illustrates another configuration example of a demultiplexer circuit provided between the data lines illustrated in FIG. 4 and a driver IC.

FIG. 7 schematically illustrates another configuration example of the demultiplexer circuit 136 provided between the data lines illustrated in FIG. 4 and the driver IC 134. FIG. 7 illustrates an example of a 1:2 DeMUX circuit for processing the outputs of the driver IC 134 without color rotation. Since each output terminal of the driver IC 134 outputs data signals for a fixed color, the time lag from the driver IC 134 to the demultiplexer circuit 136 can be made small to improve the efficiency in data write to pixel circuits.

FIG. 7 includes three demultiplexers associated with the output terminals OUT1, OUT2, and OUT3 of the driver IC 134. The demultiplexer for the output terminal OUT1 includes switching TFTs 371 and 374. The demultiplexer for the output terminal OUT2 includes switching TFTs 372 and 375. The demultiplexer for the output terminal OUT3 includes switching TFTs 373 and 376. The data signals output from the output terminals OUT1, OUT2, and OUT3 are for red color, green color, and blue color, respectively.

In similar, demultiplexer circuits having a desired ratio of 1:n (n is an integer greater than 2) can be configured for two types of driver ICs using and without using color rotation.

Figure 8:
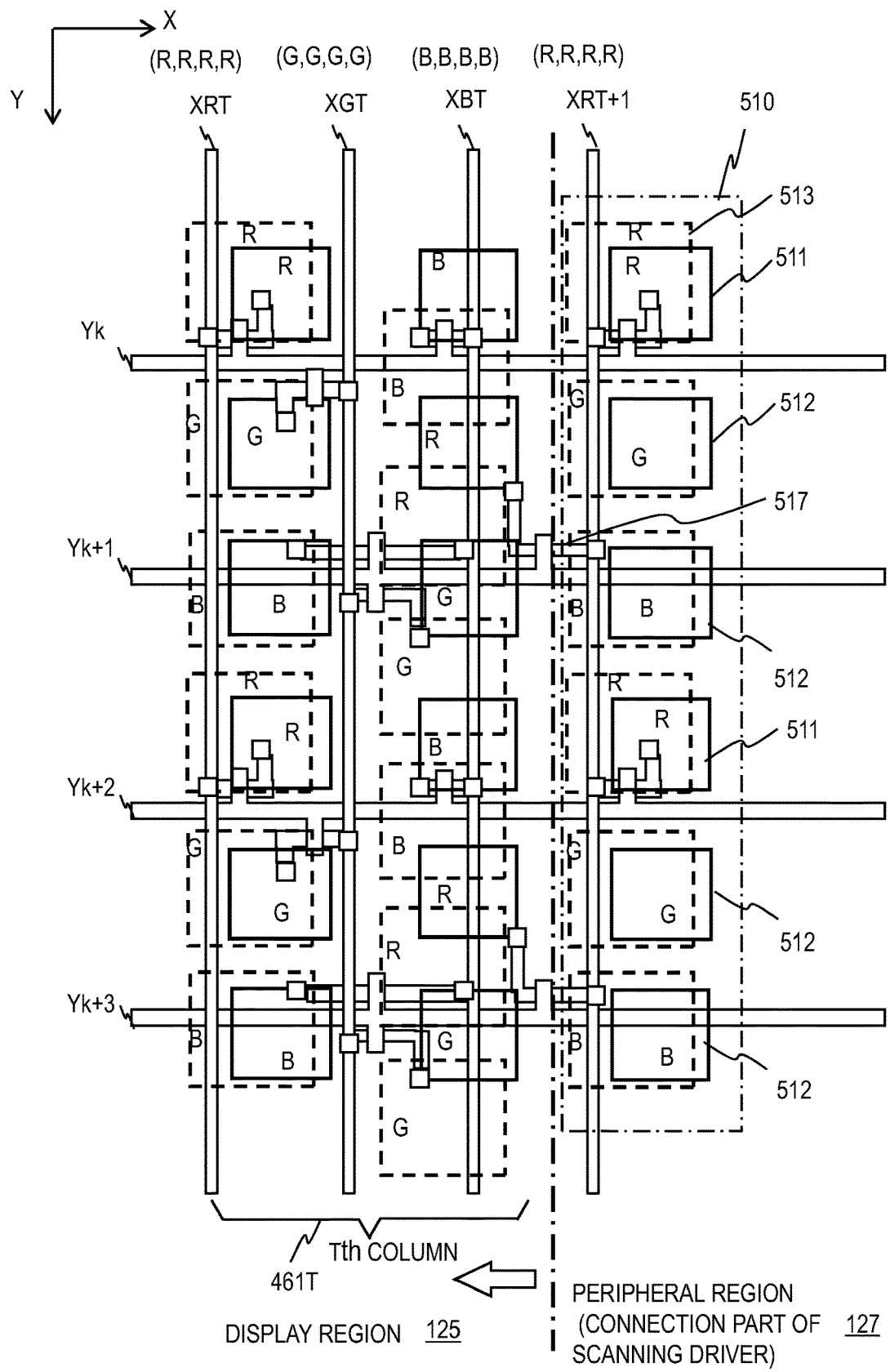
FIG. 8 illustrates an example of a circuit layout in the vicinity of an end of the display region, which corresponds to the configuration example illustrated in FIG. 4.

FIG. 8 illustrates an example of a circuit layout in the vicinity of an end of the display region, which corresponds to the configuration example illustrated in FIG. 4. FIG. 8 illustrates the T-th main-pixel column 461T at an end of the display region 125 and data lines XRT, XGT, and XBT in the data line set associated with the main-pixel column 461T. This configuration example further includes an additional data line XRT+1 for red color and dummy circuits 510 connected thereto in a peripheral region 127 outside the display region 125. The data line XRT+1 is provided outside the plurality of data line sets in the display region 125.

As described with reference to FIGS. 4 and 5, some of the pixel circuits for red color are supplied with a data signal from the data line for red color in a data line set adjacent to the data line set associated with the main-pixel column. The additional data line XRT+1 for red color transmits data signals for the pixel circuits for red color in the pixel circuit column at an end of the display region 125. A lead part 517 connects the additional data line XRT+1 for red color and a pixel circuit for red color in the pixel circuit column at the end of the display region 125. The additional data line XRT+1 for red color is the data line for red color closest to the pixel circuit column at the end of the display region 125.

In the example described with reference to FIGS. 4, 5, and 8, the data line for red color closest to a pixel circuit for red color supplies a data signal to the pixel circuit for red color. Each lead part in this configuration connects a pixel circuit for red color and a data line for red color without crossing another data line.

The additional data line XRT+1 for red color in the configuration example of FIG. 8 is connected to dummy circuits 510. As a result, loading to the additional data line XRT+1 for red color can be approximated to the loading to the other data lines in the display region 125. The dummy circuits 510 in the configuration example of FIG. 8 include dummy pixel circuits 511 for red color connected to the additional data line XRT+1 for red color and dummy pixel circuits 512 that are not connected to any data line. The dummy circuits 510 include dummy subpixels (anode electrodes) connected to the dummy pixel circuits 510. In FIG. 8, one of the dummy subpixels is provided with a reference sign 513.

The dummy pixel circuits 511 have a configuration identical to the configuration of the normal pixel circuits in the display region 125. The number of dummy pixel circuits 511 and normal pixel circuits connected to the additional data line XRT+1 for red color is equal to the number of pixel circuits connected to a data line in the display region 125. These numbers can be different. The pixel circuits not connected to the additional data line XRT+1 for red color can be excluded and the subpixels including an anode electrode can also be excluded.

The demultiplexer circuit 136 includes a circuit block for outputting data signals to the additional data line XRT+1 for red color. An example of the demultiplexer circuit 136 can include one demultiplexer block including the additional data line XRT+1 for red color as an output destination. As a result, differences in loading within the demultiplexer circuit 136 can be reduced.

Embodiment 2

In the configuration example described with reference to FIGS. 4, 5, and 8, the pixel circuits for red color, the pixel circuits for green color, and the pixel circuits for blue color have the identical shapes and occupy equal areas. In the configuration example described hereinafter, the pixel circuits for green color occupy larger area than both of the pixel circuits for red color and the pixel circuits for blue color. The visibility of green color is higher than red and blue colors and therefore, its uneven brightness is conspicuous. The variations in output current among the pixel circuits can be reduced by enlarging the storage capacitor or elongating the channel length of the driving TFT in each pixel circuit, for example. A circuit configuration for attaining less brightness unevenness is achieved by enlarging the areas of the pixel circuits for green color.

Figure 9:
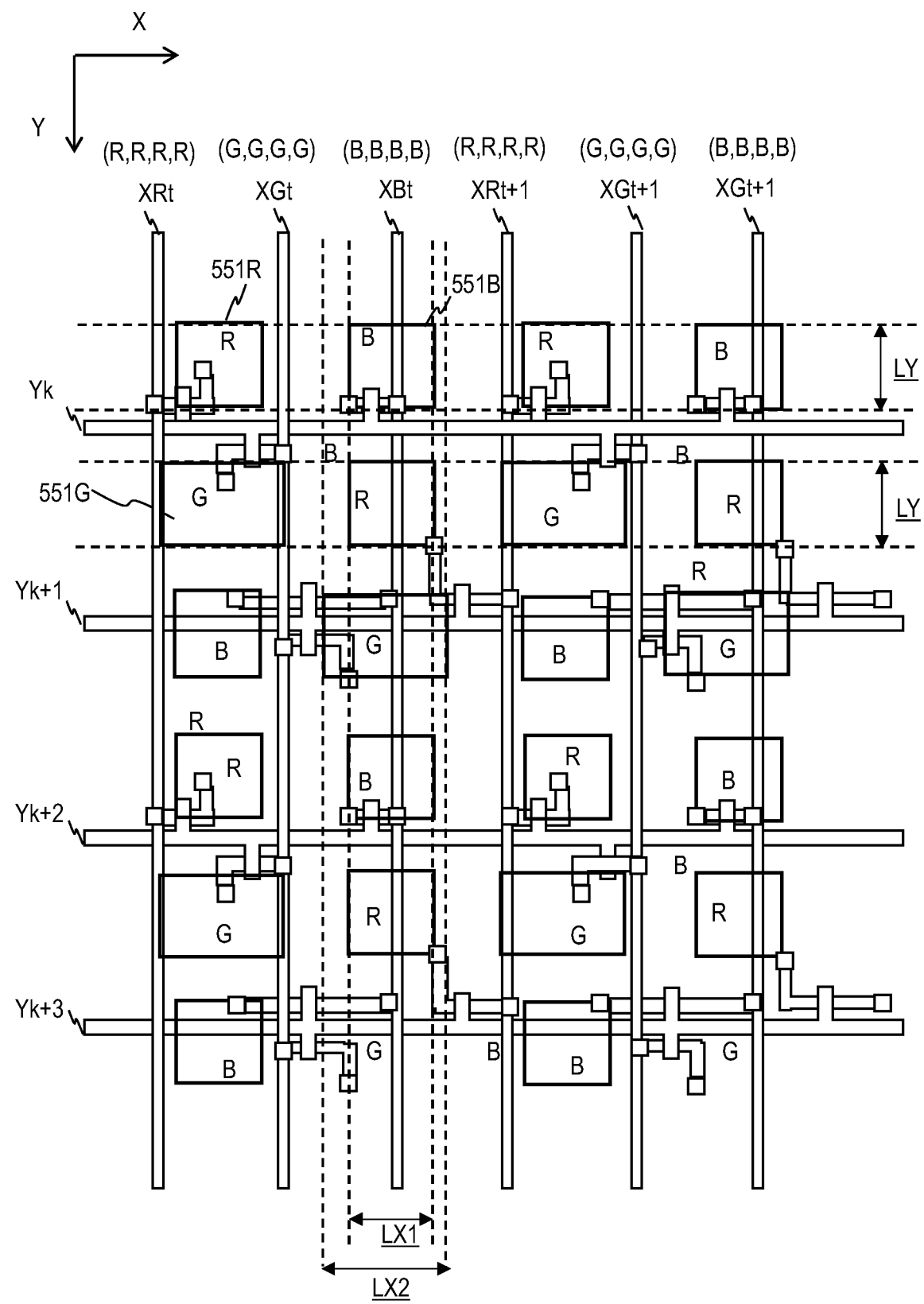
FIG. 9 illustrates a configuration example of a circuit layout, in which each pixel circuit for green color occupies a larger area than both of a pixel circuit for red color and a pixel circuit for blue color.

FIG. 9 illustrates a configuration example of a circuit layout, in which each pixel circuit for green color occupies a larger area than both of a pixel circuit for red color and a pixel circuit for blue color. One of the pixel circuits for green color is provided with a reference sign 551G, one of the pixel circuits for red color is provided with a reference sign 551R, and one of the pixel circuits for blue color is provided with a reference sign 551B, by way of example.

All pixel circuits 551R, 551G, and 551B have the same length LY in the Y-direction. The pixel circuits 551R for red color and the pixel circuits 551B for blue color have the same length LX1 in the X-direction. The pixel circuits 551G for green color have a length LX2 in the X-direction. The length LX2 is longer than the length LX1. Since the length in the Y-direction is common to all pixel circuits, this circuit layout does not affect the control lines and power lines extending in the X-direction and disposed one above another in the Y-direction, such as scanning lines and anode power lines.

Embodiment 3

Figure 10:
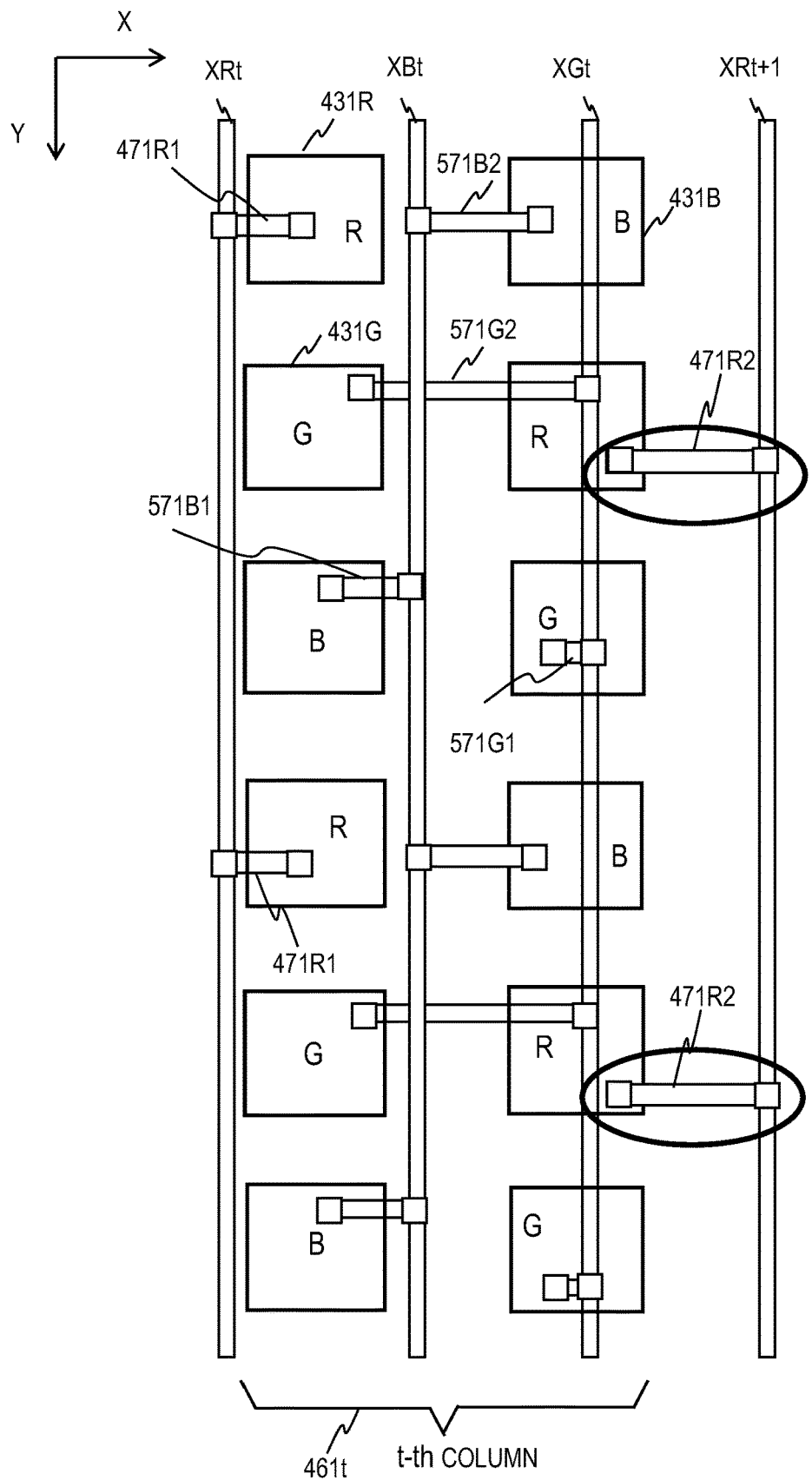
FIG. 10 illustrates another example of a circuit layout.

FIG. 10 illustrates another example of a circuit layout. In comparison to the configuration example of FIG. 5, the data line for blue color is interchanged with the data line for green color in the configuration example of FIG. 10. The following mainly describes differences from the configuration example of FIG. 5. A plurality of data lines are disposed cyclically in the order of a data line for red color, a data line for blue color, and a data line for green color. FIG. 10 includes data lines for red color XRt and XRt+1, a data line for blue color XBt, and a data line for green color XGt.

Each data line set consists of a data line for red color, a data line for blue color, and a data line for green color disposed in this order from the left. The configurations of a lead part 471R1 between the data line XRt for red color and a pixel circuit 431R for red color and a lead part 471R2 between the data line XRt+1 for red color and a pixel circuit 431R are the same as the ones in the example of FIG. 5.

The data line XBt for blue color and the pixel circuits 431B for blue color in the left pixel circuit column of the pixel circuit column pair associated with the data line XBt are connected by lead parts 571B1. The data line XBt for blue color and the pixel circuits 431B for blue color in the right pixel circuit column of the associated pixel circuit column pair are connected by lead parts 571B2. Each lead part connects the data line for blue color and a pixel circuit for blue color without crossing any data line.

The data line XGt for green color transmits data signals to the pixel circuits for green color in the pixel circuit column pair constituting the main-pixel column associated with the data line XGt. The data line XGt for green color and the pixel circuits 431G for green color in the left pixel circuit column of the pixel circuit column pair associated with the data line XGt are connected by lead parts 571G2. The data line XGt for green color and the pixel circuits 431G for green color in the right pixel circuit column of the associated pixel circuit column pair are connected by lead parts 571G1.

Each lead part 571G1 for green color connects the data line XGt for green color and a pixel circuit 431G for green color without crossing any data line. In contrast, each lead part 571G2 for green color crosses the data line XBt for blue color.

In another configuration example, a data line set can consist of a data line for blue color, a data line for green color, and a data line for red color disposed in this order from the left. In such a configuration, the configurations of the lead parts for red color, the lead parts for blue color, and the lead parts for green color illustrated in FIG. 10 are applied to the lead parts for blue color, the lead parts for green color, and the lead parts for red color, respectively.

Embodiment 4

Hereinafter, a circuit layout in another embodiment of this specification is described. In the configuration example described with reference to FIGS. 4, 5, and 8, only the data lines for red color transmit data signals to pixel circuits for red color in different pixel circuit column pairs. In the configuration example described in the following, the data lines for blue color also transmit data signals to pixel circuits for blue color in different pixel circuit column pairs, in addition to the data lines for red color. A data line for red color and a data line for blue color are data lines on both ends in the data line set associated with a pixel circuit column pair. This configuration eliminates lead parts for blue color from crossing a data line; in other words, all lead parts connect a pixel circuit and a data line without crossing any data line.

Figure 11:
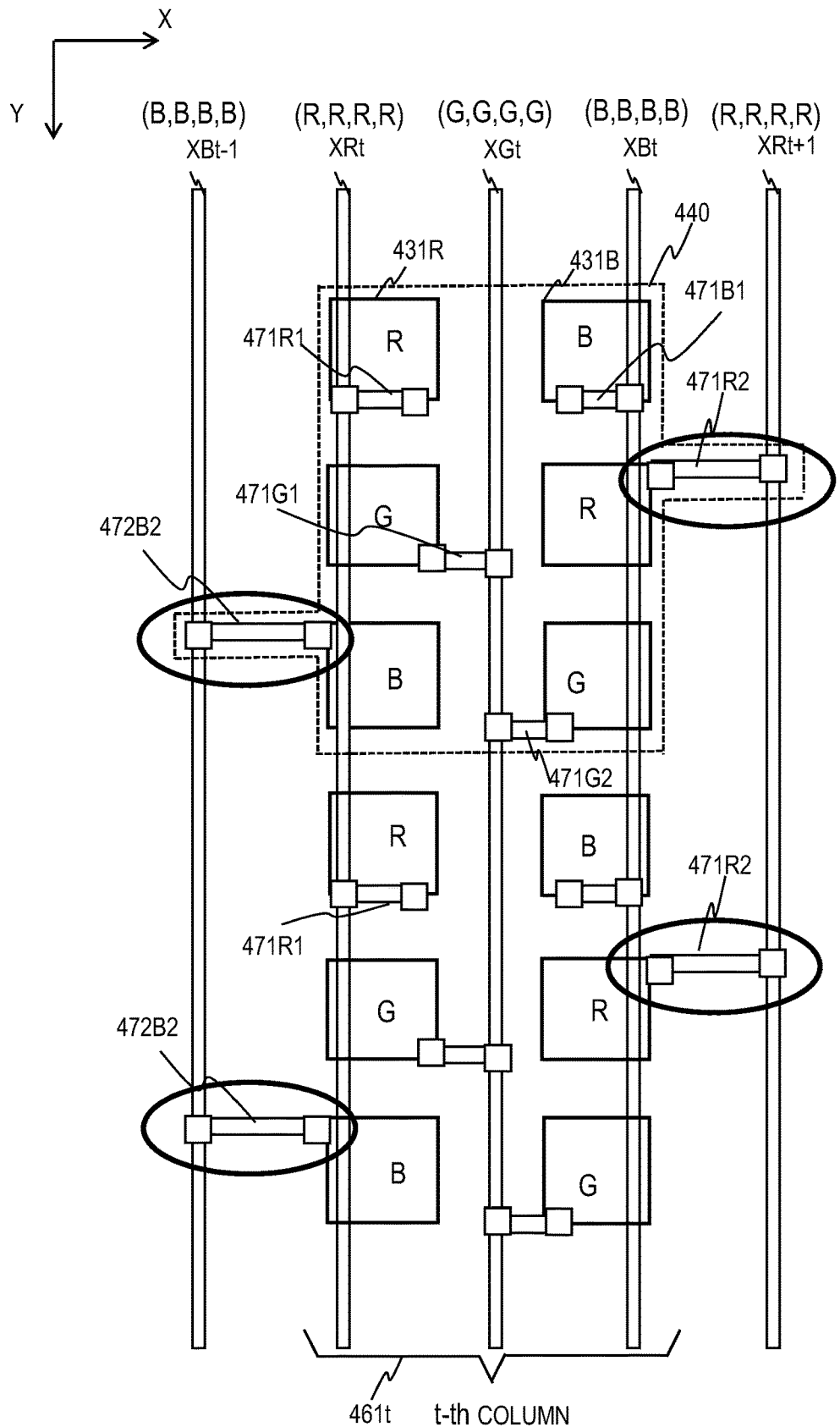
FIG. 11 illustrates a circuit layout in another embodiment of this specification.

FIG. 11 illustrates a circuit layout in an embodiment of this specification. The following mainly describes differences from the configuration example of FIG. 5. FIG. 11 illustrates data lines XBt−1, XRt, XGt, XBt, and XRt+1, pixel circuits in a main-pixel column 461t, and lead parts between the data lines and the pixel circuits. Regarding the layout of data lines and pixel circuits, the description provided with reference to FIG. 5 is applicable. The configurations of the lead parts are different from those in the example illustrated in FIG. 5.

The connections of the pixel circuits 431R for red color to the data line XRt or XRt+1 for red color by lead parts 471R1 or 471R2 for red color are the same as those in the example of FIG. 5. Regarding the connections of the pixel circuits for green color to the data line XGt for green color by lead parts 471G1 or 471G2 for green color, the description provided with reference to FIG. 5 is applicable.

In the configuration example of FIG. 11, the pixel circuits 431B for blue color in the left pixel circuit column of the pixel circuit column pair are supplied with data signals from the data line XBt−1 for blue color in an adjacent data line set. The data line XBt−1 for blue color is the data line for blue color closest to the left pixel circuit column. The data line XBt−1 for blue color and the pixel circuits 431B for blue color in the left pixel circuit column are connected by lead parts 472B2 each including a switching TFT. The lead parts 472B2 do not cross any data line.

The pixel circuits 431B for blue color in the right pixel circuit column of the pixel circuit column pair are supplied with data signals from the data line XBt for blue color in the data line set associated with this pixel circuit column pair. The data line XBt for blue color is the data line for blue color closest to the right pixel circuit column. The data line XBt for blue color and the pixel circuits 431B for blue color in the right pixel circuit column are connected by lead parts 471B1 each including a switching TFT. The lead parts 471B1 do not cross any data line.

The pixel circuits in the display region 125 are included in a plurality of layout cells 440. Each layout cell 440 consists of the pixel circuits and lead parts for two main pixels, or the pixel circuits in two columns by three rows and the lead parts extending from the pixel circuits. The layout cell 440 includes a lead part projecting leftward and a lead part projecting rightward; each of them connects to a data line in the data line set on either side of the data line set associated with the layout cell 440.

Figure 12:
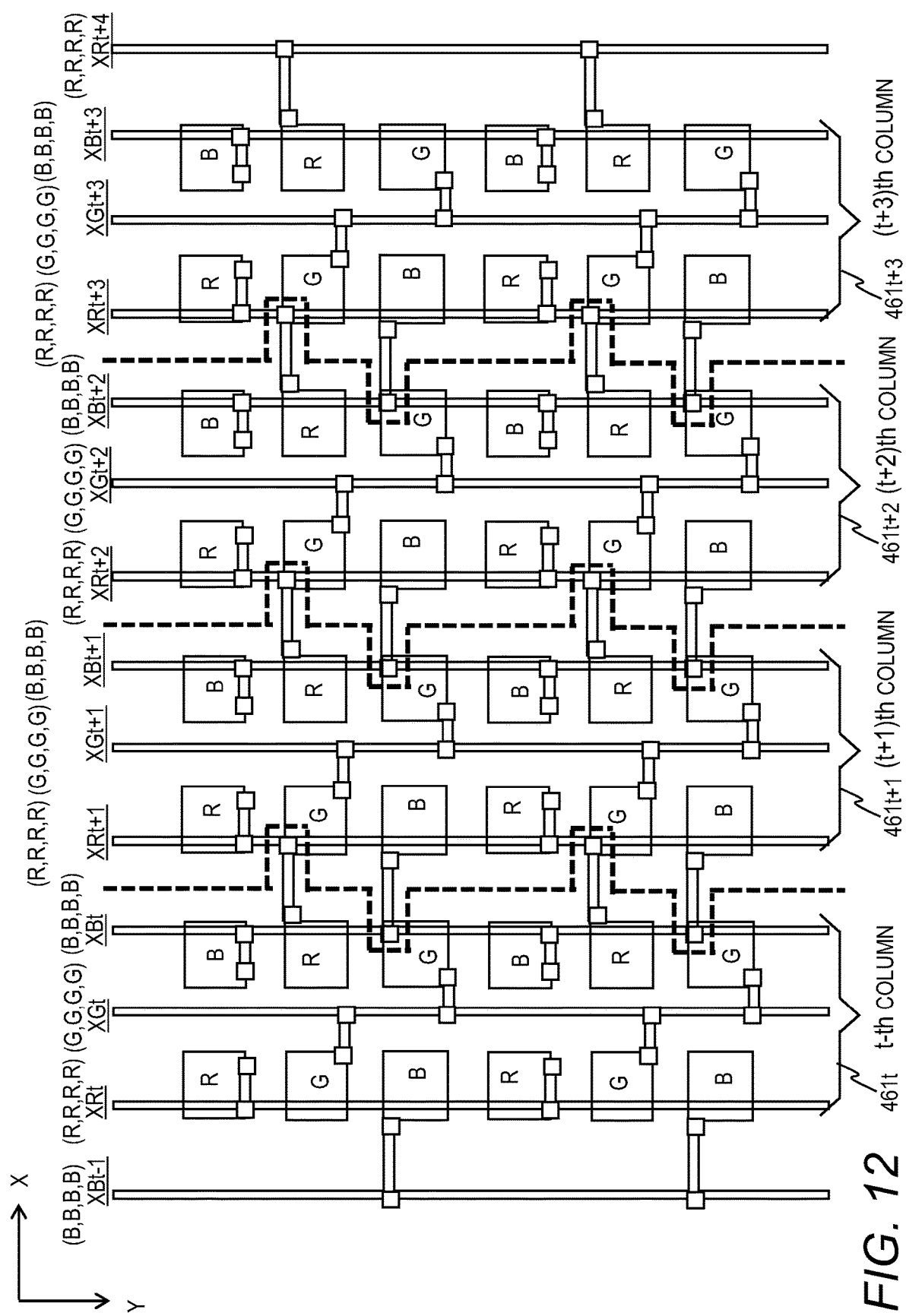
FIG. 12 illustrates a wider area in accordance with the circuit layout in FIG. 11.

FIG. 12 illustrates a wider area in accordance with the circuit layout in FIG. 11. FIG. 12 includes data lines XBt−1 to XBt+3 for blue color, data lines XRt to XRt+4 for red color, and data lines XGt to XGt+3 for green color. FIG. 12 further includes the pixel circuit columns for the t-th to the (t+3)th main-pixel columns. As described with reference to FIG. 11, each pixel circuit is connected to one data line for the same color by a lead part. In FIG. 12, each dashed line extending in the Y-direction with multiple bends represents a boundary between layout cell patterns. The boundary is formed so that the layout cell patterns are interlocking with each other.

Each data line is provided with lead parts extending from the left and lead parts extending from the right alternately in the Y-direction. As described above, a data line set consisting of three consecutive data lines for red, green, and blue colors is associated with one main-pixel column and the main-pixel column is controlled by a pixel circuit column pair consisting of two adjacent pixel circuit columns. In this example, one data line set consists of a leftmost data line for red color, a rightmost data line for blue color, and a data line for green color therebetween.

Each data line for green color is connected to pixel circuits for green color in the associated pixel circuit column pair through lead parts. For example, the data line XGt for green color is connected to the pixel circuits for green color in the pixel circuit column pair associated with the main-pixel column 461t. The same applies to the other data lines XGt+1 to XGt+3.

Each data line for red color transmits data signals to pixel circuits for red color in the associated pixel circuit column pair and pixel circuits for red color in an adjacent pixel circuit column pair. In the configuration example of FIG. 12, each data line for red color is connected to the pixel circuits for red color in the left pixel circuit column of the associated pixel circuit column pair and the pixel circuits for red color in the right pixel circuit column of the pixel circuit column pair adjacent to the associated pixel circuit column pair on the left through lead parts. For example, the data line XRt+1 for red color transmits data signals to the right pixel circuit column of the pixel circuit column pair for the main-pixel column 461t and the left pixel circuit column of the pixel circuit column pair for the main-pixel column 461t+1. The same applies to the other data lines for red color.

Each data line for blue color transmits data signals to pixel circuits for blue color in the associated pixel circuit column pair and pixel circuits for blue color in an adjacent pixel circuit column pair. In the configuration example of FIG. 12, each data line for blue color is connected to the pixel circuits for blue color in the right pixel circuit column of the associated pixel circuit column pair and the pixel circuits for blue color in the left pixel circuit column of the pixel circuit column pair adjacent to the associated pixel circuit column pair on the right through lead parts. For example, the data line XBt+1 for blue color transmits data signals to the right pixel circuit column of the pixel circuit column pair for the main-pixel column 461t+1 and the left pixel circuit column of the pixel circuit column pair for the main-pixel column 461t+2. The same applies to the other data lines for blue color.

Like an additional data line for red color described with reference to FIG. 8, the circuit layout in this example includes an additional data line for blue color outside the display region 125. Assuming that the main-pixel column 461t in FIG. 12 is the leftmost main-pixel column in the display region 125, the data line XBt−1 is the additional data line for blue color outside the display region 125.

The additional data line XBt−1 for blue color is disposed on the opposite of the data line for red color across the display region 125. The additional data line XBt−1 for blue color does not belong to any data line sets in the display region and is disposed outside the plurality of data line sets. The pixel circuits for blue color in the leftmost pixel circuit column in the display region 125 are supplied with data signals from the additional data line XBt−1 for blue color.

The additional data line XBt-1 for blue color can be connected to dummy pixel circuits, like the additional data line for red color described with reference to FIG. 8. The description about the dummy circuits provided with reference to FIG. 8 is applicable to the dummy circuits connected to the additional data line for blue color. The same applies to the description about the demultiplexer.

As described above, a pixel circuit for blue or red color is supplied with a data signal from the closest data line for blue or red color among the data line for blue or red color in the associated data line set and the data lines for blue or red color not included in the associated data line set (including the additional data lines). A pixel circuit for green color is supplied with a data signal from the data line for green color in the associated data line set. As a result, each pixel circuit is supplied with a data signal from the closest data line for the same color as the pixel circuit. Consequently, the area occupied by the lead parts including switching TFTs can be minimized to easily achieve higher-resolution pixels. Furthermore, the crosstalk caused by capacitive coupling between a data line including a lead part and the storage capacitor in a pixel circuit can be minimized.

As described above, every pixel circuit in the display region 125 is connected to one of the data lines in the display region 125 and the additional data lines through a lead part. The pixel circuits are associated in one-to-one correspondence with lead parts.

Figure 13:
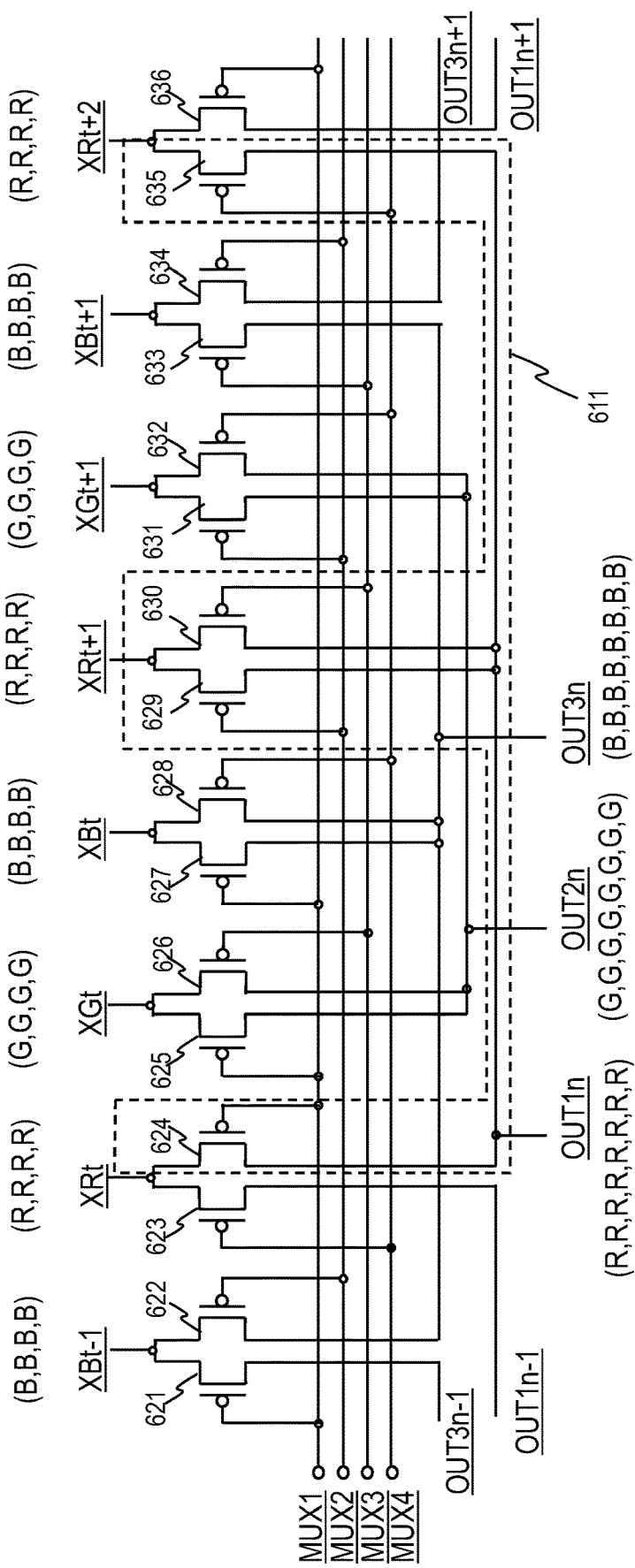
FIG. 13 illustrates a configuration example of a 1:2 demultiplexer circuit for outputting data signals to the data lines in FIG. 12.

FIG. 13 illustrates a configuration example of a 1:2 demultiplexer circuit 136 for outputting data signals to the data lines in FIG. 12. In this configuration example, each output terminal of the driver IC 134 successively outputs data signals for pixel circuits for the same color. This configuration attains high display quality.

The demultiplexer circuit 136 includes a plurality of switching TFTs 621 to 636. The switching TFTs 621 and 622 are connected to the data line XBt-1. The switching TFTs 623 and 624 are connected to the data line XRt. The switching TFTs 625 and 626 are connected to the data line XGt. The switching TFTs 627 and 628 are connected to the data line XBt.

The switching TFTs 629 and 630 are connected to the data line XRt+1. The switching TFTs 631 and 632 are connected to the data line XGt+1. The switching TFTs 633 and 634 are connected to the data line XBt+1. The switching TFTs 635 and 636 are connected to the data line XRt+2.

The ON/OFF of the switching TFTs 621, 624, 625, 627, and 636 is controlled by the selection signal from the control terminal MUX1. The ON/OFF of the switching TFTs 622, 629, 631, and 634 is controlled by the selection signal from the control terminal MUX2. The ON/OFF of the switching TFTs 626, 630, and 633 is controlled by the selection signal from the control terminal MUX3. The ON/OFF of the switching TFTs 623, 628, 632, and 635 is controlled by the selection signal from the control terminal MUX4.

The control terminals MUX1 to MUX4 cyclically and repeatedly output an ON pulse. The control terminals MUX1 and MUX2 successively output an ON pulse within one horizontal period and the control terminals MUX3 and MUX4 successively output an ON pulse within the next horizontal period.

The demultiplexer circuit 136 includes a plurality of demultiplexers. Each demultiplexer receives data signals successively from one output terminal of the driver IC 134 and outputs the data signals to the data lines selected in turn. Each demultiplexer is connected to a different output terminal of the driver IC 134 and outputs received data signals to a plurality of data lines for the same color. In FIG. 13, the demultiplexer to receive data signals from the output terminal OUT1$n$ of the driver IC 134 is surrounded by dashed line and provided with a reference sign 611.

The output terminal OUT1$n$ outputs a data signal for a pixel circuit for red color in the main-pixel column 461$t$ and a data signal for a pixel circuit for red color in the main-pixel column 461$t$+1 alternately. The demultiplexer 611 for the output terminal OUT1$n$ includes switching TFTs 624, 629, 630, and 635. The demultiplexer 611 outputs a data signal from the output terminal OUT1$n$ to a data line selected in turn from the data lines XRt, XRt+1, and XRt+2 for red color.

The output terminal OUT2$n$ outputs a data signal for a pixel circuit for green color in the main-pixel column 461$t$ and a data signal for a pixel circuit for green color in the main-pixel column 461$t$+1 alternately. The demultiplexer for the output terminal OUT2$n$ includes switching TFTs 625, 626, 631, and 632. This demultiplexer outputs a data signal from the output terminal OUT2$n$ to a data line selected alternately from the data lines XGt and XGt+1 for green color.

The output terminal OUT3$n$ outputs a data signal for a pixel circuit for blue color in the main-pixel column 461$t$ and a data signal for a pixel circuit for blue color in the main-pixel column 461$t$+1 alternately. The demultiplexer for the output terminal OUT3$n$ includes switching TFTs 622, 627, 628, and 633. This demultiplexer outputs a data signal from the output terminal OUT3$n$ to a data line selected in turn from the data lines XBt-1, XBt, and XBt+1 for blue color.

The output terminal OUT1$n$-1 outputs a data signal for a pixel circuit for red color in the main-pixel column 461$t$-2 and a data signal for a pixel circuit for red color in the main-pixel column 461$t$-1 alternately. The output terminal OUT3$n$-1 outputs a data signal for a pixel circuit for blue color in the main-pixel column 461$t$-2 and a data signal for a pixel circuit for blue color in the main-pixel column 461$t$-1 alternately. The output terminal OUT1$n$+1 outputs a data signal for a pixel circuit for red color in the main-pixel column 461$t$+2 and a data signal for a pixel circuit for red color in the main-pixel column 461$t$+3 alternately. The output terminal OUT3$n$+1 outputs a data signal for a pixel circuit for blue color in the main-pixel column 461$t$+2 and a data signal for a pixel circuit for blue color in the main-pixel column 461$t$+3 alternately.

The switching TFT 621 turns ON/OFF the conduction between the output terminal OUT3$n$-1 and the data line XBt-1. The switching TFT 623 turns ON/OFF the conduction between the output terminal OUT1$n$-1 and the data line XRt. The switching TFT 634 turns ON/OFF the conduction between the output terminal OUT3$n$+1 and the data line XBt+1. The switching TFT 636 turns ON/OFF the conduction between the output terminal OUT1$n$+1 and the data line XRt+2.

Each data line for green color is connected to only one demultiplexer and further, only one output terminal of the driver IC 134 through the demultiplexer. For example, the data lines XGt and XGt+1 transmit data signals from the output terminal OUT2$n$ only.

The data lines for red color include data lines connected to only one demultiplexer and data lines connected to different demultiplexers. For example, the data line XRt+1 is connected to the demultiplexer 611 only and transmits data signals from the output terminal OUT1$n$ only.

However, the data lines XRt and XRt+2 are each connected to two demultiplexers and transmit data signals from two output terminals of the driver IC 134. The data line XRt transmits data signals from the output terminals OUT$n$−1 and OUT1$n$. The data line XRt+2 transmits data signals from the output terminals OUT1$n$ and OUT1$n$+1.

The data lines for blue color include data lines connected to only one demultiplexer and data lines connected to different demultiplexers. For example, the data line XBt is connected to one demultiplexer only and transmits data signals from the output terminal OUT3$n$ only.

However, the data lines XBt−1 and XBt+1 are each connected to two demultiplexers and transmit data signals from two output terminals of the driver IC 134. The data line XBt−1 transmits data signals from the output terminals OUT3$n$−1 and OUT3$n$. The data line XBt+1 transmits data signals from the output terminals OUT3$n$ and OUT3$n$+1.

Among the data lines for red color connected to the same demultiplexer, the data line connected to another demultiplexer is located at an end of these data lines for red color. In the example of FIG. 13, the data lines for red color connected to the demultiplexer for the output terminal OUT1$n$ are the data lines XRt, XRt+1, and XRt+2. Among these data lines, the data line XRt located at an end is further connected to the demultiplexer for the output terminal OUT1$n$−1 and the data line XRt+2 located at the other end is further connected to the demultiplexer for the output terminal OUT1$n$+1.

In similar, among the data lines for blue color connected to the same demultiplexer, the data line connected to another demultiplexer is located at an end of these data lines for blue color. In the example of FIG. 13, the data lines for blue color connected to the demultiplexer for the output terminal OUT3$n$ are the data lines XBt−1, XBt, and XBt+1. Among these data lines, the data line XBt−1 located at an end is further connected to the demultiplexer for the output terminal OUT3$n$−1 and the data line XBt+1 located at the other end is further connected to the demultiplexer for the output terminal OUT3$n$+1.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display panel in which pixels of three colors of a first color, a second color, and a third color are disposed in a delta-nabla layout, the display panel comprising:
   a plurality of pixel circuit columns; and
   a plurality of data lines,
   wherein the plurality of pixel circuit columns extend in a first direction and are disposed side by side in a second direction perpendicular to the first direction,
   wherein each of the plurality of pixel circuit columns consists of cyclically disposed pixel circuits for the three colors,
   wherein each of the pixel circuits for the three colors is configured to control light intensity of a pixel of the same color assigned to the pixel circuit,
   wherein the plurality of pixel circuit columns compose a plurality of pixel circuit column pair each consisting of two adjacent pixel circuit columns,
   wherein the plurality of data lines extend in the first direction and are disposed side by side in the second direction,
   wherein the plurality of data lines are data lines for the three colors disposed cyclically,
   wherein each of the plurality of data lines is configured to transmit data signals to pixel circuits for the same color assigned to the data line,
   wherein the plurality of data lines include a plurality of data line sets and each data line set consists of three data lines of a data line for the first color, a data line for the second color, and a data line for the third color disposed consecutively,
   wherein the plurality of data lines includes an additional data line for the first color disposed outside the plurality of data line sets,
   wherein each of the plurality of pixel circuit column pairs is associated with a different data line set, and
   wherein each pixel circuit for the first color in each of the plurality of pixel circuit column pairs is supplied with a data signal from a data line for the first color located closer to the pixel circuit between the data line for the first color in the associated data line set and the data line for the first color located adjacent to the data line for the third color in the associated data line set outside the associated data line set.

2. The display panel according to claim 1,
   wherein each pixel circuit for the second color in each of the plurality of pixel circuit column pairs is supplied with a data signal from the data line for the second color in the associated data line set, and
   wherein all or a part of the pixel circuits for the third color in each of the plurality of pixel circuit column pairs are supplied with data signals from the data line for the third color in the associated data line set.

3. The display panel according to claim 1, wherein an area occupied by pixel circuits for the color having the highest visibility among the three colors is larger than an area occupied by pixel circuits for either of the other two colors.

4. The display panel according to claim 1, wherein each pixel circuit in the plurality of pixel circuit columns is supplied with a data signal from the closest data line for the same color assigned to the pixel circuit.

5. The display panel according to claim 1, wherein the additional data line for the first color is connected to a plurality of dummy pixel circuits.

6. The display panel according to claim 1, further comprising an additional data line for the third color disposed on the opposite of the additional data line for the first color across the plurality of data line sets,
   wherein each pixel circuit for the second color in each of the plurality of pixel circuit column pairs is supplied with a data signal from a data line for the second color in the associated data line set, and
   wherein each pixel circuit for the third color in each of the plurality of pixel circuit column pairs is supplied with a data signal from the closest data line for the third color among the data line for the third color in the associated data line set and data lines for the third color not included in the associated data line set.

7. The display panel according to claim 6, wherein each of the additional data line for the first color and the additional data line for the third color is connected to a plurality of dummy pixel circuits.

8. The display panel according to claim 1, further comprising a demultiplexer circuit including a plurality of demultiplexers,
   wherein each of the plurality of demultiplexers is configured to output each data signal received at one input terminal to a data line selected in turn from a plurality of connected data lines, and wherein all output terminals of each of the plurality of demultiplexers are connected to data lines for one same color.

9. The display panel according to claim 6, further comprising a demultiplexer circuit including a plurality of demultiplexers, wherein each of the plurality of demultiplexers is configured to output each data signal received at one input terminal to a data line selected in turn from a plurality of connected data lines, wherein all output terminals of each of the plurality of demultiplexers are connected to data lines for one same color, wherein the data lines for the first color include data lines connected to only one demultiplexer and data lines connected to different demultiplexers, wherein each of the data lines for the second color is connected to only one demultiplexer, and wherein the data lines for the third color include data lines connected to only one demultiplexer and data lines connected to different demultiplexers.

10. The display panel according to claim 9, wherein, in a first data line group consisting of data lines for the first color connected to one demultiplexer, a data line connected to any other demultiplexer is located at an end of the first data line group, and wherein, in a second data line group consisting of data lines for the third color connected to one demultiplexer, a data line connected to any other demultiplexer is located at an end of the second data line group.

11. A display device comprising:

the display panel according to claim 1; and a driver circuit, wherein the display panel further includes a demultiplexer circuit including a plurality of demultiplexers, wherein each of the plurality of demultiplexers is configured to:

receive data signals output from one output terminal of the driver circuit; and output each of the data signals to a data line selected in turn from a plurality of connected data lines.

* * * * *